(12) United States Patent
Willcock

(10) Patent No.: US 9,761,300 B1
(45) Date of Patent: Sep. 12, 2017

(54) DATA SHIFT APPARATUSES AND METHODS

(71) Applicant: Micron Technology, Inc., Boise, ID (US)

(72) Inventor: Jeremiah J. Willcock, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/358,673

(22) Filed: Nov. 22, 2016

(51) Int. Cl.
*G11C 11/00* (2006.01)
*G11C 11/4091* (2006.01)
*G11C 11/4096* (2006.01)
*G11C 11/4093* (2006.01)
*G11C 11/408* (2006.01)

(52) U.S. Cl.
CPC ...... *G11C 11/4091* (2013.01); *G11C 11/4087* (2013.01); *G11C 11/4093* (2013.01); *G11C 11/4096* (2013.01)

(58) Field of Classification Search
USPC ........................ 365/154, 233, 230.08, 230.09
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,943,947 A * | 7/1990 | Kobayashi | G11C 7/103 365/189.12 |
| 4,958,378 A | 9/1990 | Bell | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Vu Le
(74) *Attorney, Agent, or Firm* — Brooks, Cameron & Huebsch, PLLC

(57) ABSTRACT

The present disclosure includes data shift apparatuses and methods. An example apparatus includes a memory device. The example memory device includes an array of memory cells and sensing circuitry coupled to the array via a plurality of sense lines. A first shared input/output (I/O) line is configured to selectably couple a first subset of the plurality of sense lines and a second shared I/O line is configured to selectably couple a second subset of the plurality of sense lines. A shift element is configured to selectably couple the first shared I/O line to the second shared I/O line to enable a data shift operation. A controller is configured to direct selectable coupling of the array, the sensing circuitry, and the shift element to enable a shift of a data value from the first shared I/O line to the second shared I/O line.

38 Claims, 13 Drawing Sheets

(56) References Cited

U.S. PATENT DOCUMENTS

| | | |
|---|---|---|
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,327,175 B1 * | 12/2001 | Manapat .............. G11C 7/1018 365/154 |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |

(56) References Cited

U.S. PATENT DOCUMENTS

| | | |
|---|---|---|
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0245098 A1* | 10/2007 | Takada ............... G11C 11/5628 711/156 |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |

(56) References Cited

FOREIGN PATENT DOCUMENTS

| WO | 2013062596 | 5/2013 |
|---|---|---|
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, mailed Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

\* cited by examiner

DATA SHIFT APPARATUSES AND METHODS

TECHNICAL FIELD

The present disclosure relates generally to semiconductor memory and methods, and more particularly, to data shift apparatuses and methods.

BACKGROUND

Memory devices are typically provided as internal, semiconductor, integrated circuits in computers or other electronic systems. There are many different types of memory including volatile and non-volatile memory. Volatile memory can require power to maintain its data, e.g., host data, error data, etc., and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources, e.g., one or more processors, which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations, such as AND, OR, NOT, NAND, NOR, and XOR, and invert, e.g., inversion, logical operations performed on data, e.g., one or more operands. For example, functional unit circuitry may be used to perform arithmetic operations such as addition, subtraction, multiplication, and division on operands via a number of operations.

A number of components in an electronic system may be involved in providing instructions to the functional unit circuitry for execution. The instructions may be executed, for instance, by a processing resource such as a controller and host processor. Data, e.g., the operands on which the instructions will be executed, may be stored in a memory array that is accessible by the functional unit circuitry. The instructions and data may be retrieved from the memory array and sequenced and buffered before the functional unit circuitry begins to execute instructions on the data. Furthermore, as different types of operations may be executed in one or multiple clock cycles through the functional unit circuitry, intermediate results of the instructions and data may also be sequenced and buffered.

In many instances, the processing resources, e.g., processor and associated functional unit circuitry, may be external to the memory array, and data is accessed via a bus between the processing resources and the memory array to execute a set of instructions. Processing performance may be improved in a processor-in-memory device, in which a processor may be implemented internal and near to a memory, e.g., directly on a same chip as the memory array. A processing-in-memory device may save time by reducing and eliminating external communications and may also conserve power. However, shifting data between and within memory arrays of a processing-in-memory device may influence the data processing time of the processing-in-memory device.

DETAILED DESCRIPTION

Figure 1A:
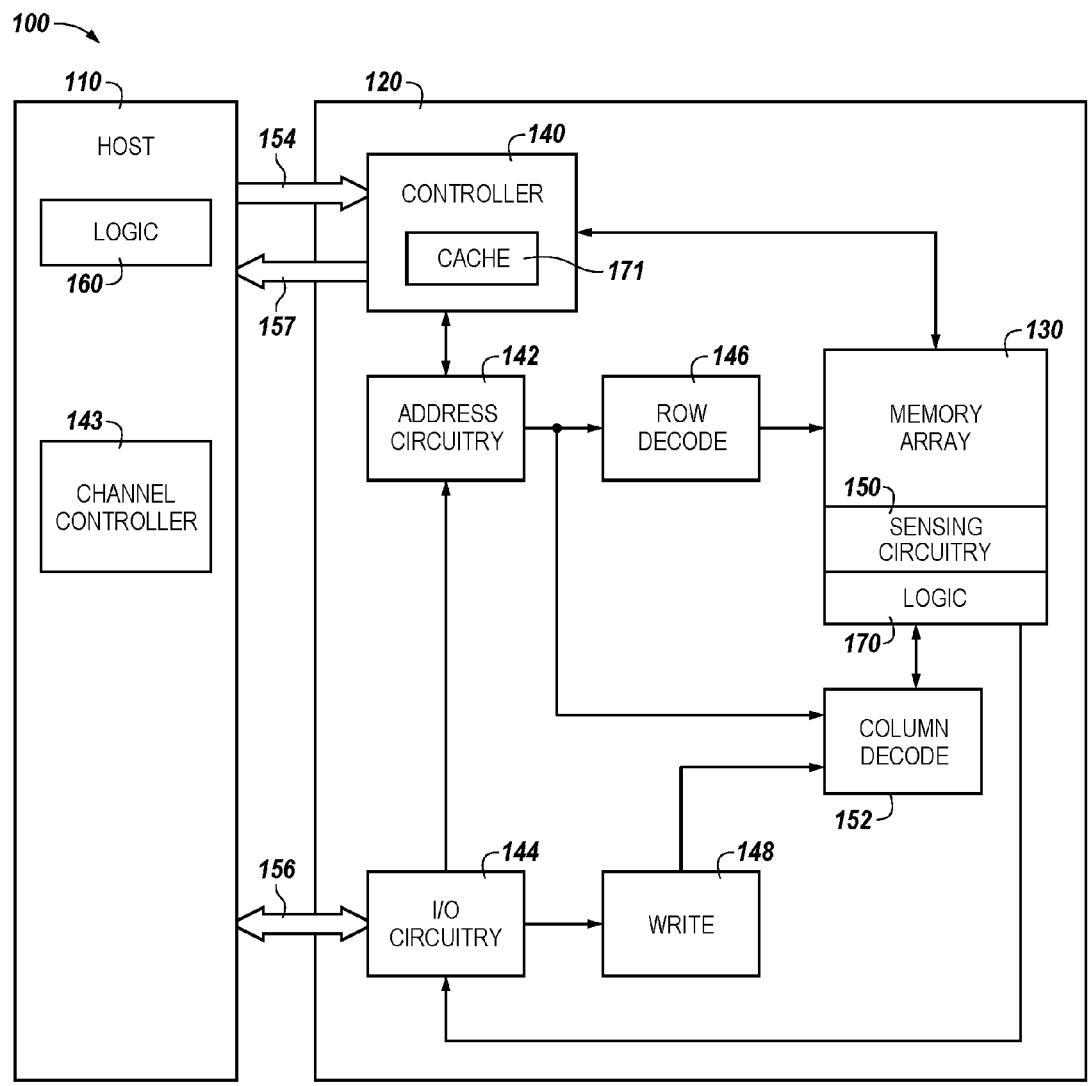
FIG. 1A is a block diagram of an apparatus in the form of a computing system including a memory device in accordance with a number of embodiments of the present disclosure.

The present disclosure includes apparatuses and methods for shifting data, e.g., horizontally and/or vertically between memory cells in a number of rows of a memory device. The data shift apparatuses and methods may, in some embodiments, be performed utilizing processor-in-memory (PIM) structures, among other configurations described herein or otherwise. In at least one embodiment, an apparatus includes a memory device. The example memory device includes an array of memory cells and sensing circuitry coupled to the array via a plurality of sense lines. A first shared input/output (I/O) line is configured to selectably couple a first subset of the plurality of sense lines and a second shared I/O line is configured to selectably couple a second subset of the plurality of sense lines. A shift element is configured to selectably couple the first shared I/O line to the second shared I/O line to enable a data shift operation. A controller is configured to direct selectable coupling of the array, the sensing circuitry, and the shift element to enable a shift of a data value from the first shared I/O line to the second shared I/O line.

Shifting of data between sensing circuitry 250, e.g., sense amplifiers 206 and/or compute components 231 selectably coupled to memory cells in row of a memory array 230, as described in connection with FIGS. 2A and 2B and elsewhere herein, may have been previously implemented by single-bit shift operations, as described herein. Single-bit shifts may shift a portion of a row of data, e.g., 128 bits, by one bit in around 6 nanoseconds (ns). In some implementations, shifting of data using the shared I/O lines described herein by a multiple of 2048 bits may be performed in a few microseconds (μs), which may be faster than using single-bit shifts for the same purpose. However, intermediate shift distances, e.g., 512 to 1024 bits, may not be readily performed by shared I/O line circuitry configured, for example, as shown and described in connection with FIGS. 4A and 4B without the shift elements, e.g., 332, 532, 632, 732, and/or 772, and associated circuitry, shown at and described in connection with FIGS. 3, 5, 6A, 6B, 7A, and 7B herein. Hence, intermediate shifts may have been performed using single-bit shifts such that the total shift operation may be performed slower than when performing longer shifts.

The data shift circuitry described herein, e.g., as shown at 561-0 and described in connection with FIG. 5, interconnects the shared I/O lines within the memory array, e.g., interconnects the shared I/O lines within a subarray, between partitions of a subarray, and/or between subarrays of a bank, among other possible configurations. As shown in and described in connection with FIGS. 3, 5, 6A, 6B, 7A, and 7B, a pair of, e.g., two, shift elements 332, 532, 632, 732, and/or 772 may be connected, e.g., at nodes 334, 634, and/or 734, to each shared I/O line within the memory array.

This structure may be repeated for portions of the shared I/O line in each subarray and/or within multiple partitions of the subarray, bank, and/or memory array for parallelism in shifting data. For example, a bank in a memory device might include a plurality of subarrays of memory cells in which a plurality of partitions can each include a respective subset of the plurality of the subarrays. In various embodiments, an I/O line shared by a plurality of partitions (e.g., a data bus for inter-partition and/or intra-partition data movement, as described herein) can be configured to separate the plurality of subarrays into the plurality of partitions by selectably connecting and disconnecting the partitions using isolation circuitry associated with the shared I/O line to form separate portions of the shared I/O line. As such, a shared I/O line associated with isolation circuitry at a plurality of locations along its length can be used to separate the partitions of subarrays into effectively separate blocks in various combinations (e.g., numbers of subarrays in each partition, depending on whether various subarrays and/or partitions are connected via the portions of shared I/O line, etc., as directed by a controller). This can enable block data movement within individual partitions of a subarray to occur substantially in parallel.

In each of the shift elements, there may be one latch per shift element, e.g., as shown at 535-1 and described in connection with FIG. 5, per shared I/O line 555-1, with the latch 535-1 connected to that shared I/O line and other shared I/O lines, e.g., 555-0 and 555-2, in a particular pattern. Accessing data via selectably coupled shared I/O lines for storage, e.g., temporary storage, of data values in the latches and sending the data values out of the latches and between the latches via selectably coupled shared I/O lines enables shift and/or rotate operations, as described herein. For example, data from subarrays may be copied into a first latch, e.g., in a write operation, of a shared I/O line and copied out, e.g., in a read operation, to a second latch of different shared I/O line.

Connection circuitry, as described herein, may be utilized to connect one shared I/O line to another shared I/O line, e.g., each of which may be selectably coupled through sensing circuitry to eight columns of memory cells, with the connection circuitry skipping over a number of intervening shared I/O lines. For example, shifts may be performed in a single step or in a plurality of steps over a plurality of bits, e.g., 64 bits or 128 bits corresponding to 64 or 128 shared I/O lines, among other possible sizes of steps and/or number of bits. Shifting as such may be performed with an increased speed, rate, and efficiency than may be accomplished with single-bit shifts. Unlike in some more general shifting implementations, e.g., a butterfly network, the data shift circuitry described herein, e.g., as shown at 561-0 and described in connection with FIG. 5, is more focused and, thus, may occupy less chip area.

As described in more detail below, the embodiments can allow a host system to allocate a number of locations, e.g., subarrays and portions of subarrays, in one or more DRAM banks to hold, e.g., store, data. A host system and a controller may perform the address resolution on an entire block of program instructions, e.g., PIM command instructions, and data and direct, e.g., control, allocation and storage of data and commands in connection with storage, shift, and/or rotation operations into allocated locations, e.g., subarrays, portions of subarrays, columns, rows, etc., within a destination, e.g., target bank. Writing and/or reading of data and commands may, in some embodiments, utilize a normal DRAM path to the DRAM device. As the reader will appreciate, while a DRAM-style PIM device is discussed with regard to examples presented herein, embodiments are not limited to a PIM DRAM implementation.

Data movement between and within PIM banks, e.g., subarrays and portions of subarrays therein, may affect whether PIM operations are completed (performed) efficiently. Accordingly, the present disclosure presents structures and processes that can increase a speed, rate, and efficiency of data movement in a PIM array by using an improved data path, e.g., a shift element and associated circuitry selectably coupled to a shared I/O line of a DRAM implementation, as described herein. As used herein, data movement, e.g., to move data, moving data, etc., is an inclusive term intended to include shifting, transferring, and/or rotating of data values as described herein, among other such data movements.

In previous approaches, data may be transferred from the array and sensing circuitry, e.g., via a bus comprising I/O lines, to a processing resource external to the memory array, such as a processor, microprocessor, and/or compute engine that may be located on a host, which may comprise ALU circuitry and other functional unit circuitry configured to perform the appropriate operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access, e.g., firing of a column decode 152 signal, in order to transfer data from sense lines onto I/O lines, e.g., local and global I/O lines, moving the data to a periphery of the memory array, and providing the data to the compute function.

Furthermore, the circuitry of the processing resource(s), e.g., a compute engine, may not conform to pitch rules associated with a memory array. For example, the cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which can affect chip size and memory density, for example.

For example, the sensing circuitry 150 described herein can be formed on a same pitch as a pair of complementary sense lines. As an example, a pair of complementary memory cells may have a cell size with a $6F^2$ pitch, e.g., 3F×2F. If the pitch of a pair of complementary sense lines for the complementary memory cells is 3F, then the sensing circuitry being on pitch indicates the sensing circuitry, e.g., a sense amplifier and/or corresponding compute component per respective pair of complementary sense lines, is formed to fit within the 3F pitch of the complementary sense lines.

Furthermore, the circuitry of the processing resource(s), e.g., a compute engine, such as an ALU, of various prior systems may not conform to pitch rules associated with a memory array. For example, the memory cells of a memory array may have a $4F^2$ or $6F^2$ cell size. As such, the devices, e.g., logic gates, associated with ALU circuitry of previous systems may not be capable of being formed on pitch with the memory cells, e.g., on a same pitch as the sense lines, which can affect chip size and/or memory density, for example. In the context of some computing systems and subsystems, e.g., a central processing unit (CPU), data may be processed in a location that is not on pitch and/or on chip with memory, e.g., memory cells in the array, as described herein. The data may be processed by a processing resource associated with a host, for instance, rather than on pitch with the memory.

In contrast, a number of embodiments of the present disclosure can include the sensing circuitry 150, e.g., including sense amplifiers 206 and/or compute components 231, and/or logic circuitry, e.g., 170, 213, and/or 560, being formed on pitch with the memory cells of the array. The sensing circuitry and/or logic circuitry can be configured for, e.g., capable of, performing compute functions, e.g., logical operations.

PIM capable device operations can use bit vector based operations. As used herein, the term "bit vector" is intended to mean logical storage of a number of bits on a bit vector memory device, e.g., a PIM device. Thus, as used herein a "bit vector operation" is intended to mean an operation that is performed on one or more bit vectors, e.g., used by a PIM device. For example, a row of virtual address space in the PIM device may have a bit length of 16K bits. e.g., corresponding to 16K complementary pairs of memory cells in a DRAM configuration. Sensing circuitry 150, as described herein, for such a 16K bit row may include a corresponding 16K processing elements, e.g., compute components, as described herein, formed on pitch with the sense lines selectably coupled to corresponding memory cells in the 16K bit row. A compute component in the PIM device may operate as a one bit processing element on a single bit of the bit vector of the row of memory cells sensed by the sensing circuitry 150, e.g., sensed by and/or stored in a sense amplifier paired with the compute component, as described herein.

A number of embodiments of the present disclosure include sensing circuitry 150, e.g., sense amplifiers 206 and/or compute components 231, formed on pitch with sense lines of an array of memory cells. The sensing circuitry and compute circuitry are capable of performing data sensing and compute functions and storage, e.g., caching, of data local to the array of memory cells.

In order to appreciate the improved data movement, shifting, and/or rotation techniques described herein, a discussion of an apparatus for implementing such techniques, e.g., a memory device having PIM capabilities and associated host, follows. According to various embodiments, program instructions, e.g., PIM commands, involving a memory device having PIM capabilities can distribute implementation of the PIM commands and data over multiple sensing circuitries that can implement operations and can move and store the PIM commands and data within the memory array, e.g., without having to transfer such back and forth over an A/C and data bus between a host and the memory device. Thus, data for a memory device having PIM capabilities can be accessed and used in less time and using less power. For example, a time and power advantage can be realized by increasing the speed, rate, and efficiency of data being moved around and stored in a computing system in order to process requested memory array operations, e.g., reads, writes, etc.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numbers in the drawings, indicate that a number of the particular feature so designated can be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more", e.g., a number of memory arrays can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of instructions, e.g., control signals, and data, as appropriate to the context.

The figures herein follow a numbering convention in which the first digit or digits correspond to the figure number and the remaining digits identify an element or component in the figure. Similar elements or components between different figures may be identified by the use of similar digits. For example, 105 may reference element "05" in FIG. 1, and a similar element may be referenced as 205 in FIGS. 2A and 2B. As will be appreciated, elements shown in the various embodiments herein can be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, including sensing amplifiers, e.g., sense amplifier 206 as shown in and described in connection with FIGS. 2A and 2B and at corresponding reference numbers in FIGS. 3, 4A, and 4B, and compute circuitry, e.g., compute component 231 as shown in and described in connection with FIGS. 2A and 2B and at corresponding reference numbers in FIGS. 3, 4A, and 4B, shift elements 532 and associated circuitry shown in and described in connection with FIGS. 3, 5, 6A, 6B, 7A, and 7B, and peripheral sense amplifier and logic 170 might each also be separately considered an "apparatus."

The system 100 can include a host 110 coupled, e.g., connected, to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and backplane and can include a number of processing resources, e.g., one or more processors, microprocessors, or some other type of controlling circuitry. The system 100 can include separate integrated circuits or both the host 110 and the memory device 120 can be on the same integrated circuit. The system 100 can be, for instance, a server system and a high performance computing (HPC) system and a portion thereof. Although the example shown in FIG. 1A illustrates a system having a Von Neumann architecture, embodiments of the present disclosure can be implemented in non-Von Neumann architectures, which may not include one or more components, e.g., CPU, ALU, etc., often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1A, embodiments are not so limited. For instance, memory device 120 may include a number of memory arrays 130, e.g., a number of banks of DRAM cells, NAND flash cells, etc., in addition to a number subarrays, as described herein. Accordingly, descriptions in the present disclosure may be made with regard to PIM and/or DRAM architectures by way of example and/or clarity. However, unless explicitly stated otherwise, the scope of the present disclosure and claims is not limited to PIM and/or DRAM architectures.

The memory device 120 can include address circuitry 142 to latch address signals provided over a data bus 156, e.g., an I/O bus from the host 110, by I/O circuitry 144, e.g., provided to external ALU circuitry and to DRAM DQs via local I/O lines and global I/O lines. Status and exception information can be provided from the controller 140 on the memory device 120 to a channel controller 143, through, for example, a bus 557, e.g., a high speed interface (HSI) out-of-band (OOB) bus, which in turn can be provided from the channel controller 143 to the host 110. Address signals are received through address circuitry 142 and decoded by a row decoder 146 and a column decoder 152 to access the memory array 130. Data can be sensed (read) from memory array 130 by sensing voltage and current changes on sense lines (digit lines) using a number of sense amplifiers, as described herein, of the sensing circuitry 150. A sense amplifier can read and latch a page, e.g., a row, of data from the memory array 130. Additional compute circuitry, as described herein, can be coupled to the sensing circuitry 150 and can be used in combination with the sense amplifiers to sense, store, e.g., cache and buffer, move, shift, and/or rotate data. The I/O circuitry 144 can be used for bidirectional data communication with host 110 over the data bus 156, e.g., a 64 bit wide data bus. The write circuitry 148 can be used to write data to the memory array 130.

Controller 140, e.g., bank control logic and sequencer, can decode signals, e.g., commands, provided by control bus 154 from the host 110. The controller 140 can control operations by issuing control signals determined from the decoded commands from the host 110. These signals can include chip enable signals, write enable signals, read enable signals, and address latch signals that can be used to control operations performed on the memory array 130, including data sense, data store, data move, data shift, data rotate, data write, data read, and data erase operations, among other operations. In various embodiments, the controller 140 can be responsible for executing instructions from the host 110 and accessing the memory array 130. The control signals may be executed by processing resources external to and/or internal to a memory array 130, e.g., by compute components 231 in sensing circuitry 150, as described herein. The controller 140 can be a state machine, a sequencer, or some other type of controller. The controller 140 can control shifting data, e.g., right or left, in a row of and/or between rows of a number of subarrays, partitions, and/or banks, e.g., memory array 130.

Examples of the sensing circuitry 150 are described further below, e.g., in FIGS. 2A, 2B, 3, 4A, and 4B. For instance, in a number of embodiments, the sensing circuitry 150 can include a number of sense amplifiers and/or a number of compute components, which may serve as an accumulator and can be used to perform operations, e.g., on data associated with complementary sense lines.

In a number of embodiments, the sensing circuitry 150 can be used to perform operations using data stored in memory array 130 as inputs and participate in movement, e.g., shifting and/or rotation, of the data for writing and storage operations back to a different location in the memory array 130 without transferring the data via a sense line address access, e.g., without firing a column decode signal. As such, various compute functions can be performed using, and within, sensing circuitry 150 rather than (or in association with) being performed by processing resources external to the sensing circuitry 150, e.g., by a processor associated with host 110 and other processing circuitry, such as ALU circuitry, located on device 120, such as on controller 140 or elsewhere.

In various previous approaches, data associated with an operand, for instance, would be read from memory via sensing circuitry and provided to external ALU circuitry, e.g., in the host, via I/O lines, e.g., via local I/O lines and global I/O lines. The external ALU circuitry could include a number of registers and would perform compute functions using the operands, and the result would be transferred back to the array via the I/O lines. In contrast, in a number of embodiments of the present disclosure, sensing circuitry 150 is configured to perform operations on data stored in memory array 130 and store the result back to the memory array 130 without enabling a local I/O line and global I/O line coupled to the sensing circuitry 150, e.g., for read and/or write operations based on host commands. In contrast, the data movement operations described herein utilize a cooperative interaction between the sensing circuitry 150 and shared I/O lines 155 described herein. The sensing circuitry 150 and the shared I/O lines 155 may be formed on chip with the memory cells of the array, e.g., formed on the same chip as the memory cells in the array. Additional peripheral sense amplifier and logic 170 can be coupled to the sensing circuitry 150. The sensing circuitry 150 and the peripheral sense amplifier and logic 170 can cooperate in performing operations, according to some embodiments described herein.

As such, in a number of embodiments, circuitry external to memory array 130 and sensing circuitry 150 is not needed to perform compute functions as the sensing circuitry 150 can perform the appropriate operations in order to perform such compute functions without the use of an external processing resource. Therefore, the sensing circuitry 150 may be used to complement and to replace, at least to some extent, such an external processing resource (or at least the bandwidth consumption of such an external processing resource).

In a number of embodiments, the sensing circuitry 150 may be used to perform operations, e.g., to execute instructions, in addition to operations performed by an external processing resource, e.g., host 110. For instance, either of the host 110 and the sensing circuitry 150 may be limited to performing only certain operations and a certain number of operations.

Enabling a local I/O line and global I/O line, e.g., for read and/or write operations, can include enabling, e.g., turning on, a transistor having a gate coupled to a decode signal, e.g., a column decode 152 signal, and a source/drain coupled to the local I/O line and/or global I/O line. However, embodiments are not limited to not enabling a local I/O line and global I/O line. For instance, in a number of embodiments, the sensing circuitry 150 can be used to perform operations, such as data movement, shifting, and/or rotation, without enabling column decode lines 152 of the array. However, the local I/O line(s) and global I/O line(s) may be enabled in order to transfer a result to a suitable location other than back to the memory array 130, e.g., to an external register.

Figure 1B:
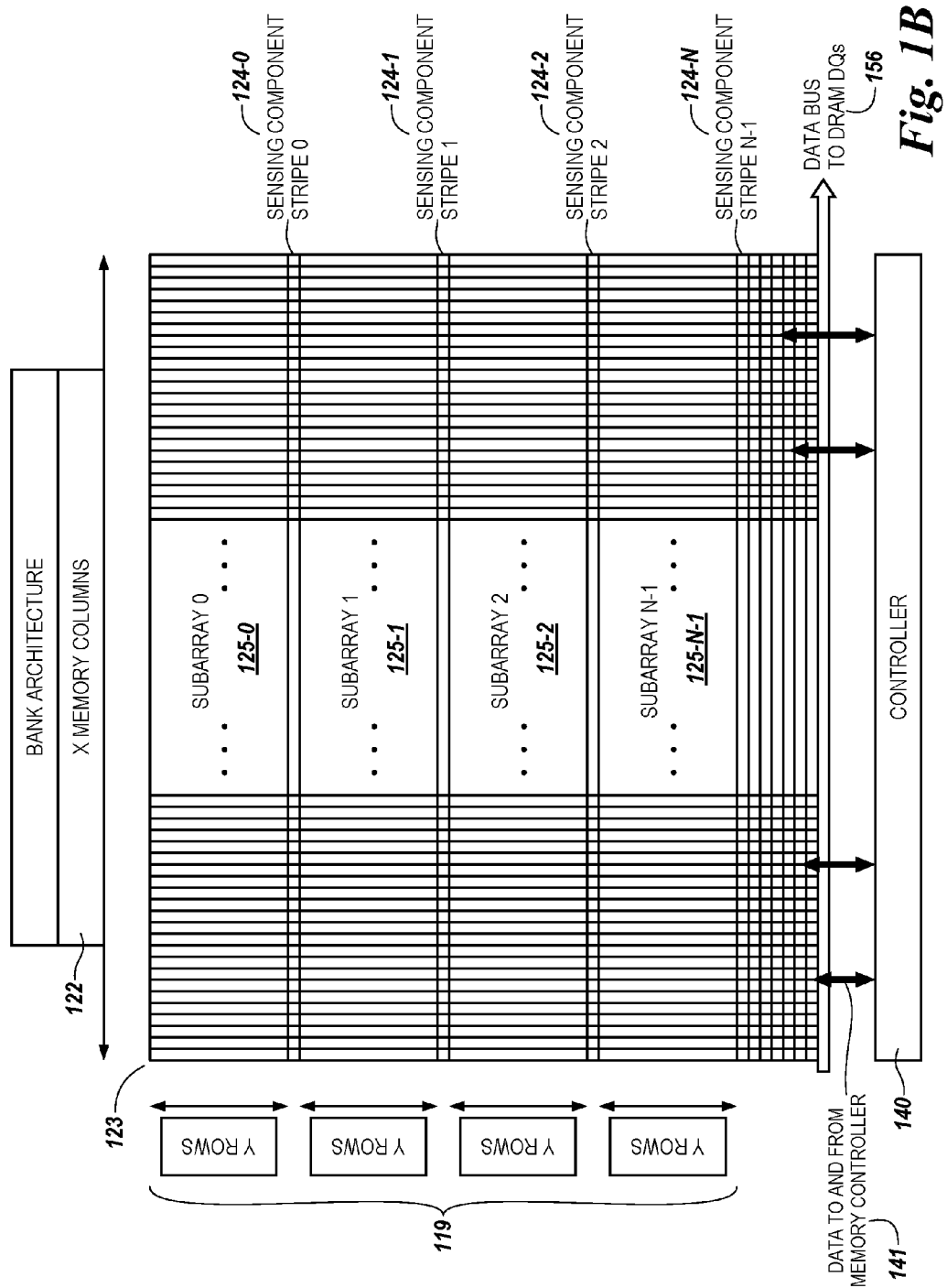
FIG. 1B is a block diagram of a bank section of a memory device in accordance with a number of embodiments of the present disclosure.

FIG. 1B is a block diagram of a bank section 123 of a memory device in accordance with a number of embodiments of the present disclosure. For example, bank section 123 can represent an example section of a number of bank sections of a bank of a memory device, e.g., bank section 0, bank section 1, . . . , bank section M (not shown). As shown in FIG. 1B, a bank architecture can include a plurality of memory columns 122 shown horizontally as X, e.g., 16,384 columns in an example DRAM bank and bank section. Additionally, the bank section 123 may be divided into subarray 0, subarray 1, . . . , and subarray N–1, e.g., 128 subarrays, shown at 125-0, 125-1, . . . , 125-N–1, respectively, that are separated by amplification regions configured to be coupled to a data path, e.g., the shared I/O line described herein. As such, the subarrays 125-0, 125-1, . . . , 125-N–1 can each have amplification regions shown 124-0, 124-1, . . . , 124-N–1 that correspond to sensing component stripe 0, sensing component stripe 1, . . . , and sensing component stripe N–1, respectively.

Each column 122 is configured to be coupled to sensing circuitry 150, as described in connection with FIG. 1A and elsewhere herein. As such, each column in a subarray can be coupled individually to a sense amplifier and/or compute component that contribute to a sensing component stripe for that subarray. For example, as shown in FIG. 1B, the bank architecture can include sensing component stripe 0, sensing component stripe 1, . . . , sensing component stripe N–1 that each have sensing circuitry 150 with sense amplifiers and/or compute components that can, in various embodiments, be used as registers, cache and data buffering and that are coupled to each column 122 in the subarrays 125-0, 125-1, . . . , 125-N–1. The compute component within the sensing circuitry 150 coupled to the memory array 130, as shown in FIG. 1A, can complement the cache 171 associated with the controller 140.

Each of the of the subarrays 125-0, 125-1, . . . , 125-N–1 can include a plurality of rows 119 shown vertically as Y, e.g., each subarray may include 512 rows in an example DRAM bank. Example embodiments are not limited to the example horizontal and vertical orientation of columns and rows described herein or the example numbers thereof.

As shown in FIG. 1B, the bank architecture can be associated with controller 140. The controller 140 shown in FIG. 1B can, in various examples, represent at least a portion of the functionality embodied by and contained in the controller 140 shown in FIG. 1A. The controller 140 can direct, e.g., control, input of control signals based on commands and data 141 to the bank architecture and output of data from the bank architecture, e.g., to the host 110, along with control of data movement, shifting, and/or rotation in the bank architecture, as described herein. The bank architecture can include a data bus 156, e.g., a 64 bit wide data bus, to DRAM DQs, which can correspond to the data bus 156 described in connection with FIG. 1A.

Figure 1C:
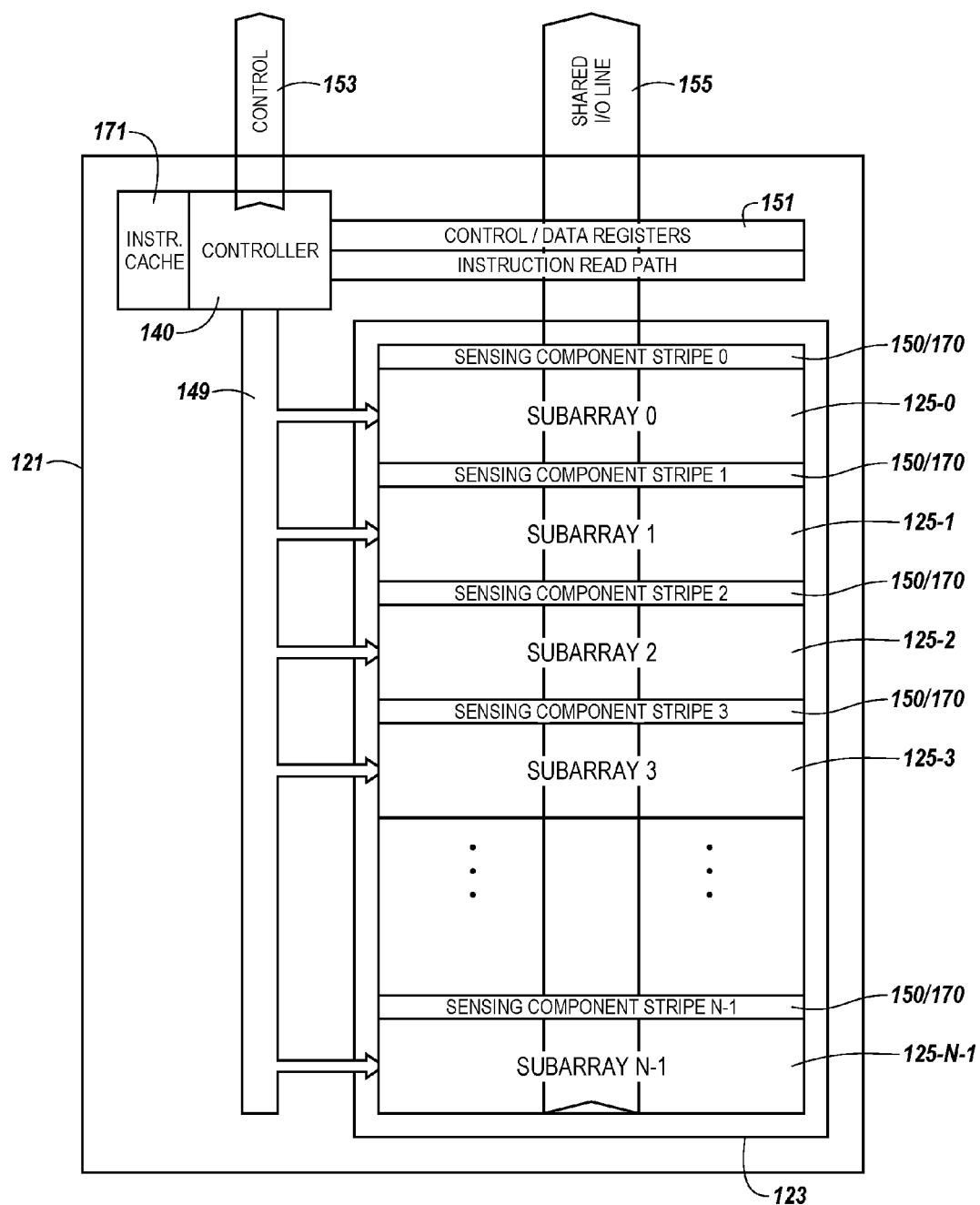
FIG. 1C is a block diagram of a bank of a memory device in accordance with a number of embodiments of the present disclosure.

FIG. 1C is a block diagram of a bank 121 of a memory device in accordance with a number of embodiments of the present disclosure. For example, bank 121 can represent an example bank to a memory device, e.g., bank 0, bank 1, . . . , bank M (not shown). As shown in FIG. 1C, a bank architecture can include an address/control (A/C) path 153, e.g., a bus, coupled to a controller 140. Again, the controller 140 shown in FIG. 1C can, in various examples, represent at least a portion of the functionality embodied by and contained in the controller 140 shown in FIGS. 1A and 1B.

As shown in FIG. 1C, a bank architecture can include a plurality of bank sections, e.g., bank section 123, in a particular bank 121. As further shown in FIG. 1C, a bank section 123 can be subdivided into a plurality of subarrays, e.g., subarray 0, subarray 1, . . . , subarray N–1 shown at 125-1, 125-2, . . . , 125-N–1, respectively separated by sensing component stripes 124-0, 124-1, . . . , 124-N–1, as shown in FIG. 1B, that include sensing circuitry and logic circuitry 150/170, as shown in FIG. 1A and described further in connection with FIGS. 2A, 2B, 3, 4A, and 4B.

As described herein, an I/O line can be selectably shared by a plurality of partitions, subarrays, rows, and particular columns of memory cells via the sensing component stripe coupled to each of the subarrays. For example, the sense amplifier and/or compute component of each of a selectable subset of a number of columns, e.g., eight column subsets of a total number of columns, can be selectably coupled to each of the plurality of shared I/O lines for data values stored (cached) in the sensing component stripe to be moved, e.g., shifted, rotated, transferred, transported, and/or fed, to each of the plurality of shared I/O lines. Because the singular forms "a", "an", and "the" can include both singular and plural referents herein, "a shared I/O line" can be used to refer to "a plurality of shared I/O lines", unless the context clearly dictates otherwise. Moreover, "shared I/O lines" is an abbreviation of "plurality of shared I/O lines".

As shown schematically in FIG. 1C, an architecture of a bank 121 and each section 123 of the bank can include a plurality of shared I/O lines 155, e.g., data path, bus, configured to couple to the plurality of subarrays 125-0, 125-1, . . . , 125-N–1 of memory cells of the bank section 123 and a plurality of banks (not shown). The shared I/O lines 155 can be selectably coupled between subarrays, rows, and particular columns of memory cells via the sensing component stripes represented by 124-0, 124-1, . . . , 124-N–1 shown in FIG. 1B. As noted, the sensing component stripes 124-0, 124-1, . . . , 124-N–1 each include sensing circuitry 150 with sense amplifiers and/or compute components configured to couple to each column of memory cells in each subarray, as shown in FIG. 1A and described further in connection with FIGS. 2A, 2B, 3, 4A, and 4B.

The shared I/O lines 155 can be utilized to increase a speed, rate, and efficiency of data movement, shifting, and/or rotation in a PIM array, e.g., within subarrays, between subarrays, and/or between the shift elements selectably connected to the shared I/O lines. In at least one embodiment, using the shared I/O lines 155 provides an improved data path by providing at least a thousand bit width. In one embodiment, 2048 shared I/O lines are coupled to 16,384 columns to provide a 2048 bit width. The illustrated shared I/O lines 155 can be formed on chip with the memory cells of the array.

In some embodiments, the controller 140 may be configured to provide instructions (control signals based on commands) and data to a plurality of locations of a particular bank 121 in the memory array 130 and to the sensing component stripes 124-0, 124-1, . . . , 124-N–1 via the shared I/O lines 155 with control and data registers 151. For example, the control and data registers 151 can provide instructions to be executed using by the sense amplifiers and/or the compute components of the sensing circuity 150 in the sensing component stripes 124-0, 124-1, . . . , 124-N–1. FIG. 1C illustrates an instruction cache 171 associated with the controller 140 and coupled to a write path 149 to each of the subarrays 125-0, . . . , 125-N–1 in the bank 121.

Implementations of PIM DRAM architecture may perform processing at the sense amplifier and/or compute component level. Implementations of PIM DRAM architecture may allow only a finite number of memory cells to be connected to each sense amplifier, e.g., around 512 memory cells. A sensing component stripe 124 may include from around 8,000 to around 16,000 sense amplifiers. For example, a sensing component stripe 124 may be configured to couple to an array of 512 rows and around 16,000 columns. A sensing component stripe can be used as a building block to construct the larger memory. In an array for a memory device, there may be 128 sensing component stripes, which corresponds to 128 subarrays, as described herein. Hence, 512 rows times 128 sensing component stripes would yield around 66,000 rows intersected by around 16,000 columns to form around a 1 gigabit DRAM.

As such, when processing at the sense amplifier level, there are only 512 rows of memory cells available to perform logic functions with each other and it may not be possible to easily perform logic functions on multiple rows where data is coupled to different sensing component stripes. To accomplish processing of data in different subarrays coupled to different sensing component stripes, all the data to be processed is moved into the same subarray in order to be coupled to the same sensing component stripe.

However, DRAM implementations have not been utilized to move data from one sensing component stripe to another sensing component stripe. As mentioned, a sensing component stripe can contain as many as 16,000 sense amplifiers, which corresponds to around 16,000 columns or around 16,000 data values, e.g., bits, of data to be stored, e.g., cached, from each row. A DRAM DQ data bus, e.g., as shown at 156 in FIGS. 1A and 1B, may be configured as a 64 bit part. As such, to move (transfer) the entire data from a 16,000 bit row from one sensing component stripe to another sensing component stripe using a DRAM DQ data bus would take, for instance, 256 cycles, e.g., 16,000 divided by 64.

In order to achieve data movement, shifting, and/or rotation conducted with a high speed, rate, and efficiency from one sensing component stripe to another in PIM DRAM implementations, shared I/O lines 155 are described herein. For example, with 2048 shared I/O lines configured as a 2048 bit wide shared I/O line 155, movement of data from a full row, as just described, would take 8 cycles, a 32 times increase in the speed, rate, and efficiency of data movement. As such, compared other PIM DRAM implementations, e.g., relative to a 64 bit wide data path, utilization of the structures and processes described in the present disclosure saves time for data movement, shifting, and/or rotation. In various embodiments, time may be saved, for example, by not having to read data out of one bank, bank section, and subarray thereof, storing the data, and then writing the data in another location and/or by reducing the number of cycles for data movement, shifting, and/or rotation.

Figure 2A:
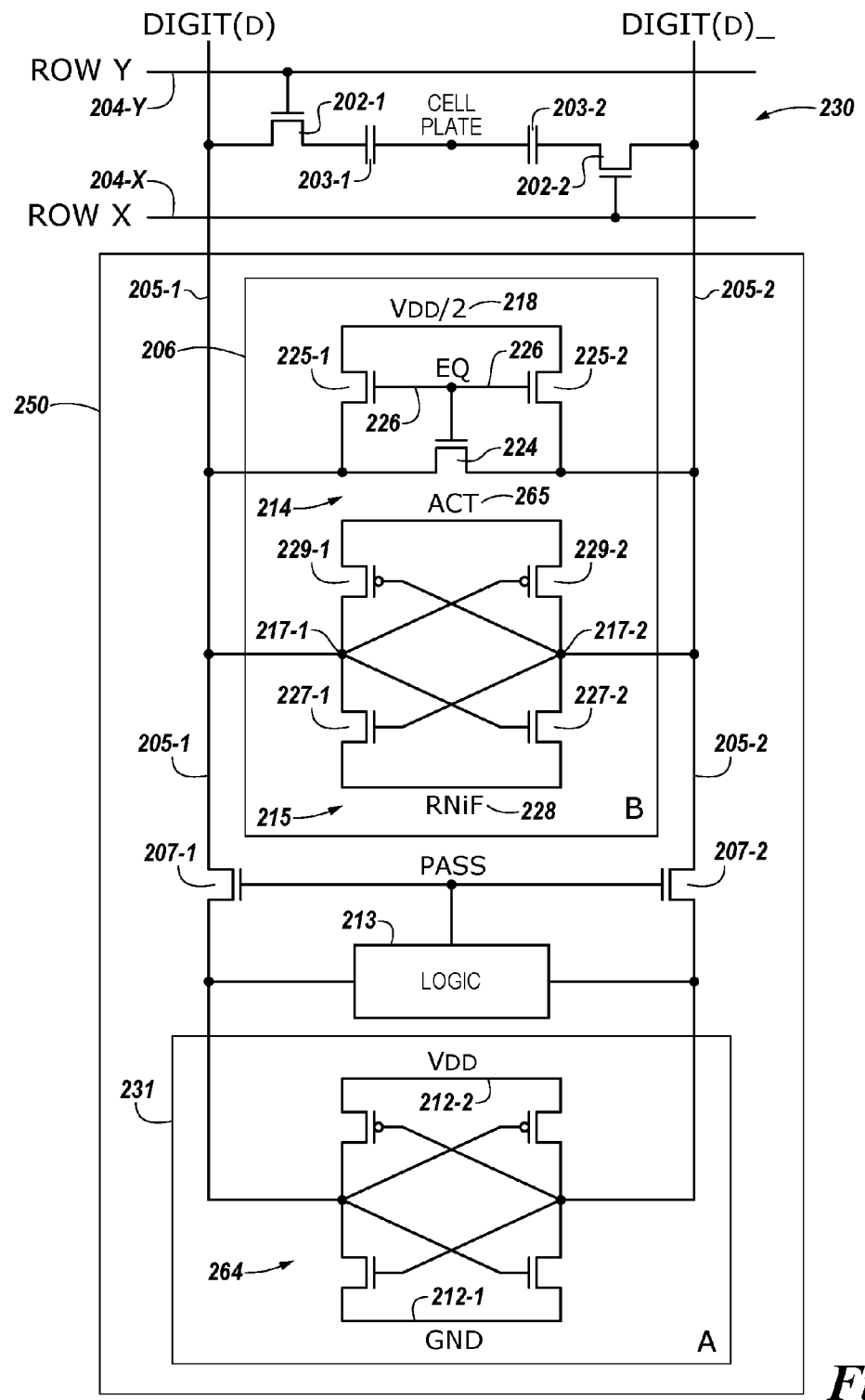
FIG. 2A is a schematic diagram illustrating sensing circuitry of a memory device in accordance with a number of embodiments of the present disclosure.

FIG. 2A is a schematic diagram illustrating sensing circuitry 250 in accordance with a number of embodiments of the present disclosure. The sensing circuitry 250 can correspond to sensing circuitry 150 shown in FIG. 1A.

A memory cell can include a storage element, e.g., capacitor, and an access device, e.g., transistor. For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used, e.g., 2T2C with two transistors and two capacitors per memory cell. In a number of embodiments, the memory cells may be destructive read memory cells, e.g., reading the data stored in the cell destroys the data such that the data originally stored in the cell is refreshed after being read.

Figure 2B:
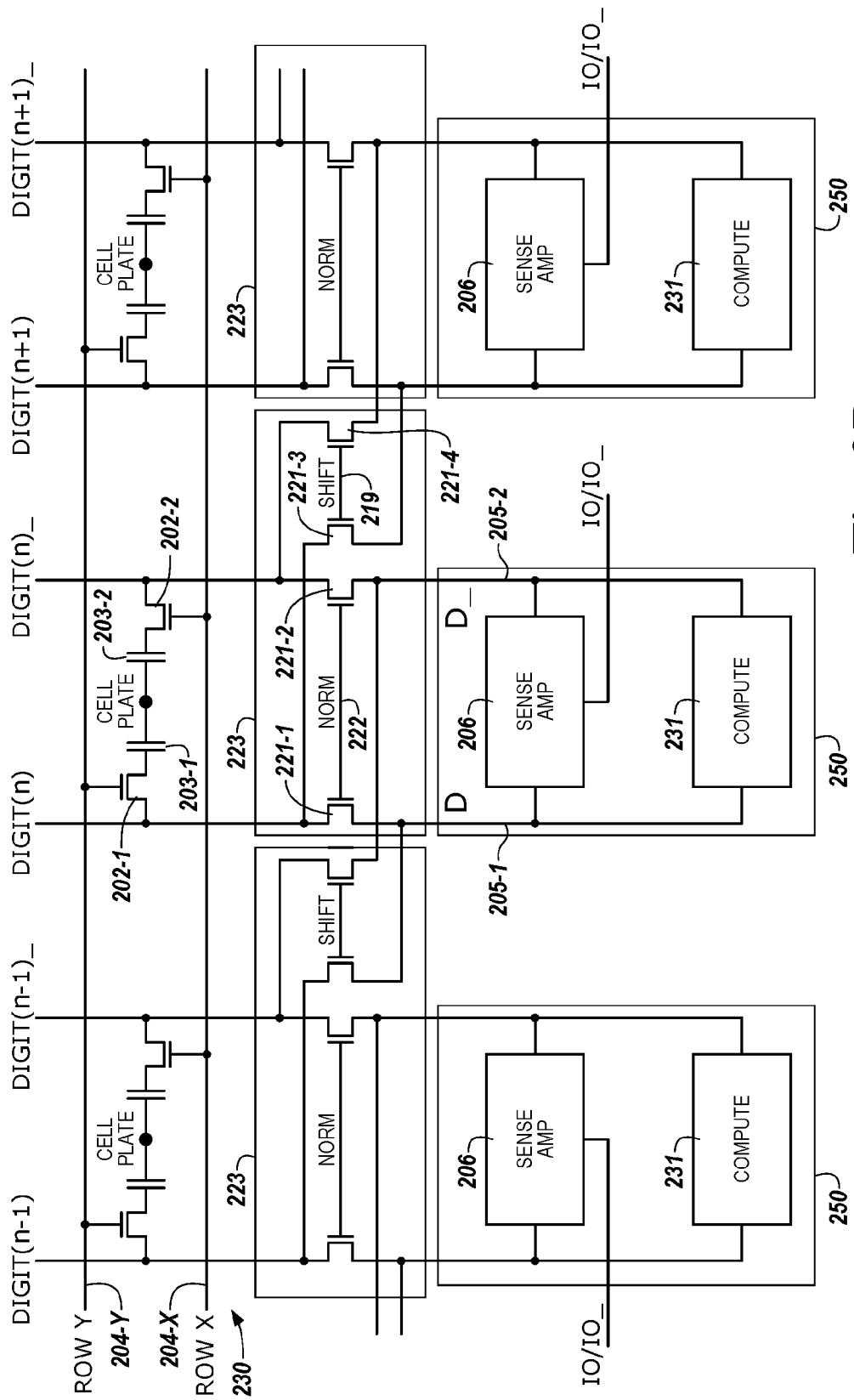
FIG. 2B is a schematic diagram illustrating circuitry configured for a single-bit shift operation in accordance with a number of embodiments of the present disclosure.
Figure 3:
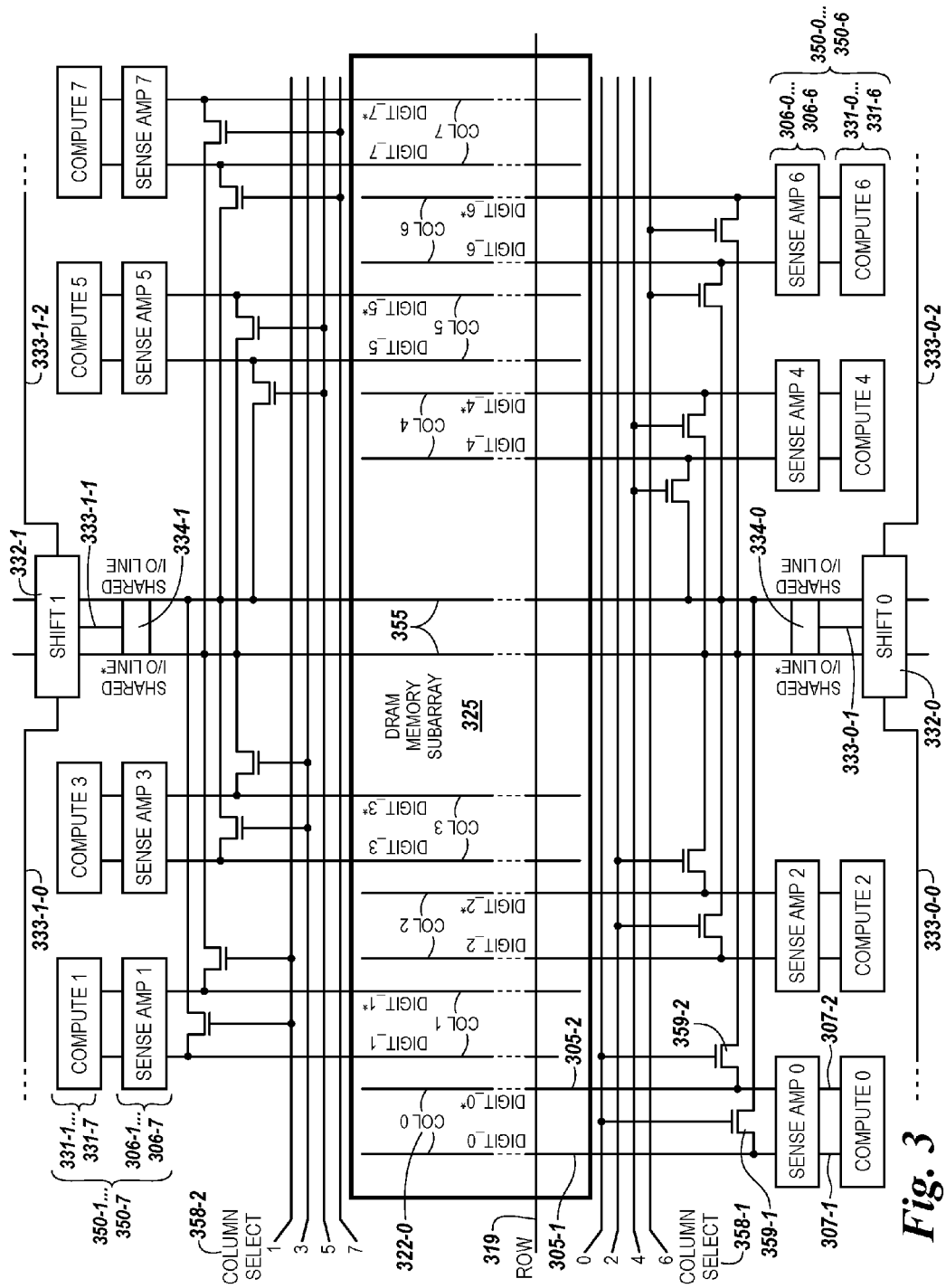
FIG. 3 is a schematic diagram illustrating a portion of circuitry configured for a data shift operation between shared input/output (I/O) lines in accordance with a number of embodiments of the present disclosure.
Figure 4A:
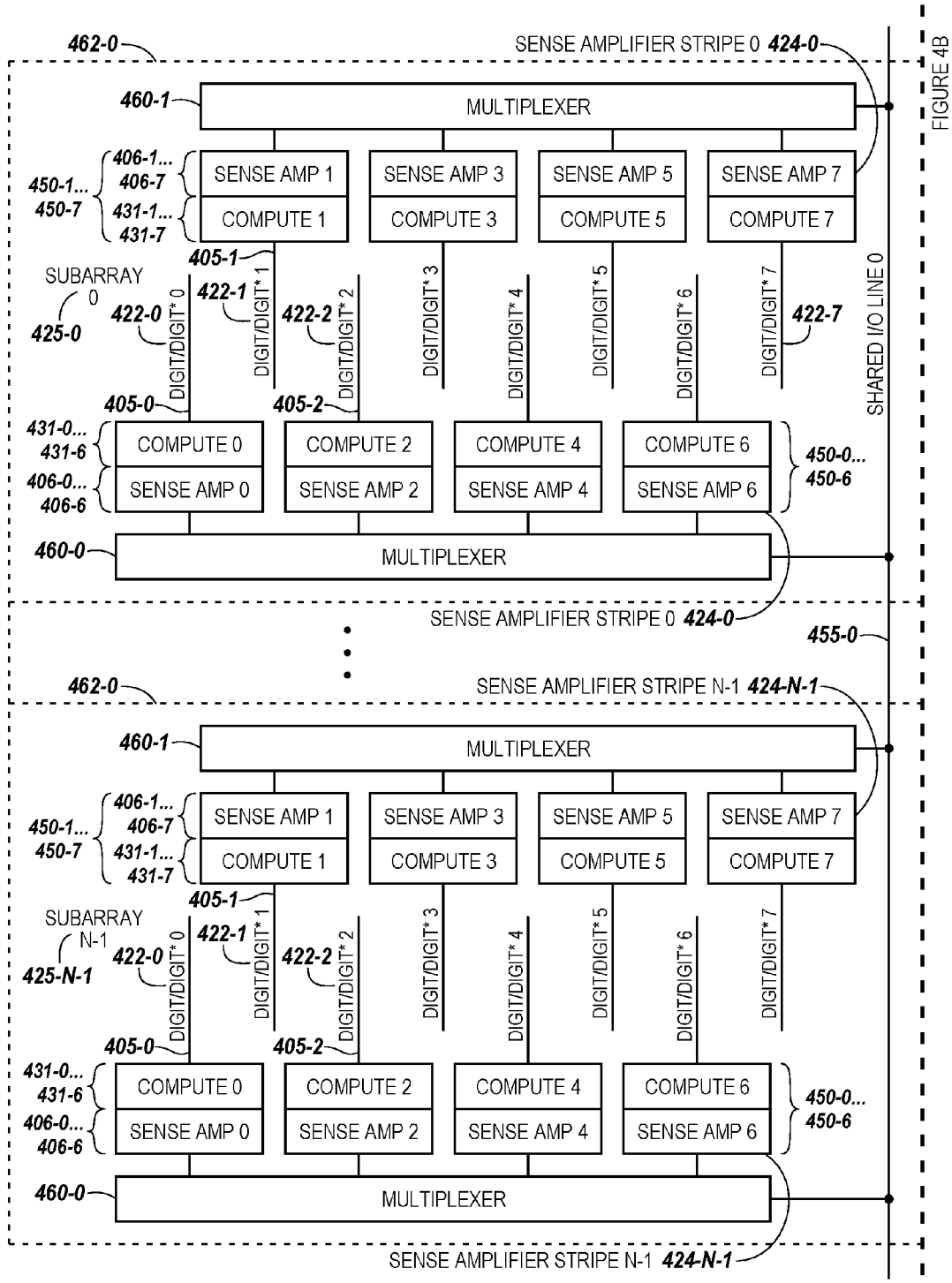
FIGS. 4A and 4B are a schematic diagram illustrating circuitry configured for a data shift operation between portions of a memory device via shared O/I lines in accordance with a number of embodiments of the present disclosure.
Figure 4B:
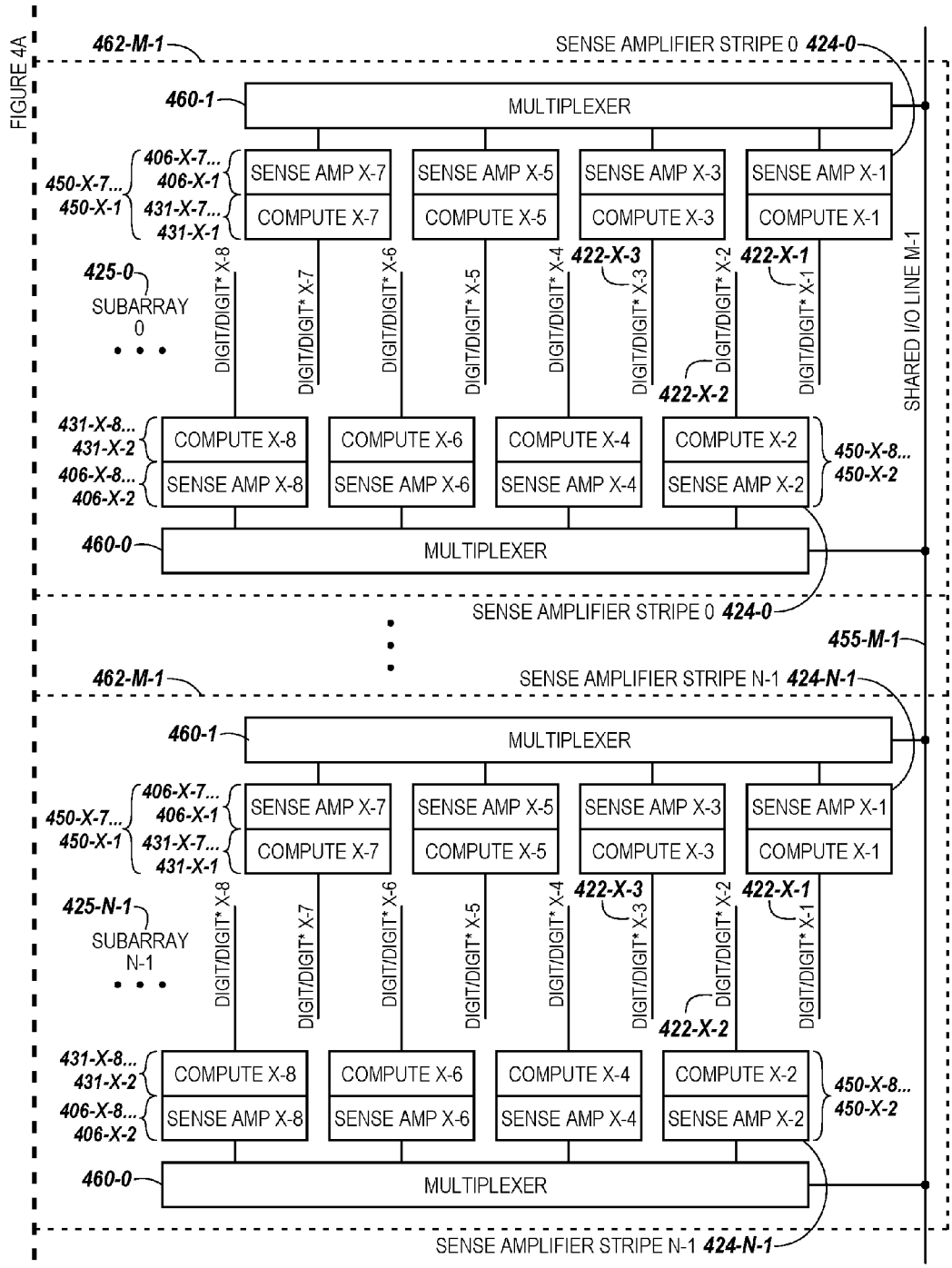

The cells of the memory array 230 can be arranged in rows coupled by access (word) lines 204-X (Row X), 204-Y (Row Y), etc., and columns coupled by pairs of complementary sense lines, e.g., digit lines DIGIT(D) and DIGIT (D)_ shown in FIG. 2A, DIGIT(n) and DIGIT(n)_ shown in FIG. 2B, and DIGIT_0 and DIGIT_0* shown in FIGS. 3, 4A, and 4B. The individual sense lines corresponding to each pair of complementary sense lines can also be referred to as digit lines 205-1 for DIGIT (D) and 205-2 for DIGIT (D)_, respectively, or corresponding reference numbers in FIGS. 3, 4A, and 4B. Although only one pair of complementary digit lines are shown in FIG. 2A, embodiments of the present disclosure are not so limited, and an array of memory cells can include additional columns of memory cells and digit lines, e.g., 4,096, 8,192, 16,384, etc.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2A, can be coupled to each of capacitors 203-1 and 203-2. The cell plate can be a common node to which a reference voltage, e.g., ground 212-1, can be applied in various memory array configurations.

The memory array 230 is configured to couple to sensing circuitry 250 in accordance with a number of embodiments of the present disclosure. In the embodiment illustrated in FIG. 2A, the sensing circuitry 250 comprises a sense amplifier 206 and/or a compute component 231 corresponding to respective columns of memory cells, e.g., coupled to respective pairs of complementary digit lines. The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and/or the compute component 231 and swap gate logic for controlling swap gates that couple the pair of complementary digit lines transposed between the sense amplifier 206 and/or the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value, e.g., logic state, stored in a selected memory cell. The sense amplifier 206 can comprise a cross coupled latch, which can be referred to herein as a primary latch. In the example illustrated in FIG. 2A, the circuitry corresponding to sense amplifier 206 comprises a latch 215 including four transistors coupled to a pair of complementary digit lines D 205-1 and (D)_ 205-2. However, embodiments are not limited to this example. The latch 215 can be a cross coupled latch, e.g., gates of a pair of transistors, such as n-channel transistors, e.g., NMOS transistors, 227-1 and 227-2 are cross coupled with the gates of another pair of transistors, such as p-channel transistors, e.g., PMOS transistors, 229-1 and 229-2. The cross coupled latch 215 comprising transistors 227-1, 227-2, 229-1, and 229-2 can be referred to as a primary latch.

In operation, when a memory cell is being sensed, e.g., read, the voltage on one of the digit lines 205-1 (D) or 205-2 (D)_ will be slightly greater than the voltage on the other one of digit lines 205-1 (D) or 205-2 (D)_. An ACT 265 signal and an RNiF 228 signal can be driven low to enable, e.g., fire, the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage, e.g., ground 212-1, through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2A. As an example, the sense amplifier 206 can be a current-mode sense amplifier and a single-ended sense amplifier, e.g., sense amplifier coupled to one digit line. Also, embodiments of the present disclosure are not limited to a folded digit line architecture such as that shown in FIG. 2A.

The sense amplifier 206 may, e.g., in conjunction with the compute component 231, be operated to perform various operations using data from an array as input. In a number of embodiments, the result of an operation can be stored back to the array without transferring the data via a digit line address access, e.g., without firing a column decode signal such that data is transferred to circuitry external from the array and sensing circuitry via local I/O lines. As such, a number of embodiments of the present disclosure can enable performing operations and compute functions associated therewith using less power than various previous approaches. Additionally, since a number of embodiments eliminate the need to transfer data across local and global I/O lines in order to perform compute functions, e.g., between memory and discrete processor, a number of embodiments can enable an increased, e.g., faster, processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage, e.g., $V_{DD}/2$ 218, where $V_{DD}$ 212-2 is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage, e.g., $V_{DD}/2$ 218.

Although FIG. 2A shows sense amplifier 206 comprising the equilibration circuitry 214, embodiments are not so limited, and the equilibration circuitry 214 may be implemented discretely from the sense amplifier 206, implemented in a different configuration than that shown in FIG. 2A, or not implemented at all.

As described further below, in a number of embodiments, the sensing circuitry 250, e.g., sense amplifier 206 and/or compute component 231, can be operated to perform a selected operation and initially store the result in one of the sense amplifier 206 or the compute component 231 without transferring data from the sensing circuitry via a local or global I/O line, e.g., without performing a sense line address access via activation of a column decode signal, for instance.

As shown in FIG. 2A, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors, e.g., PMOS transistors, included in the secondary latch can have their respective sources coupled to a supply voltage, e.g., $V_{DD}$ 212-2 and the pair of cross coupled n-channel transistors, e.g., NMOS transistors, of the secondary latch can have their respective sources selectively coupled to a reference voltage, e.g., ground 212-1, such that the secondary latch is continuously enabled. The configuration of the compute component 231 is not limited to that shown in FIG. 2A, and various other embodiments are feasible.

FIG. 2B is a schematic diagram illustrating circuitry configured for a single-bit shift operation in accordance with a number of embodiments of the present disclosure. As described in connection with FIG. 2A, a memory cell can include a storage element, e.g., capacitor, and an access device, e.g., transistor. For instance, transistor 202-1 and capacitor 203-1 may be a memory cell, and transistor 202-2 and capacitor 203-2 may be another memory cell, etc. In this example, the memory array 230 is a DRAM array of 1T1C (one transistor one capacitor) memory cells. The cells of the memory array 230 are arranged in rows coupled by word lines 204-X (Row X), 204-Y (Row Y), etc., and columns coupled by pairs of complementary data lines DIGIT(n−1)/ DIGIT(n−1)_, DIGIT(n)/DIGIT(n)_, DIGIT(n+1)/DIGIT (n+1)_. The individual data lines corresponding to each pair of complementary data lines can also be referred to as data lines 205-1 (D) and 205-2 (D_) respectively. Although only three pair of complementary data lines are shown in FIG. 2B, embodiments of the present disclosure are not so limited, and an array of memory cells can include additional columns of memory cells and/or data lines, e.g., 4,096, 8,192, 16,384, etc.

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2B, can be coupled to each of capacitors 203-1 and 203-2. The cell plate can be a common node to which a reference voltage, e.g., ground 212-1, can be applied in various memory array configurations.

The memory array 230 is coupled to sensing circuitry 250 in accordance with a number of embodiments of the present disclosure. In this example, the sensing circuitry 250 comprises a sense amplifier 206 and/or a compute component 231 corresponding to respective columns of memory cells, e.g., coupled to respective pairs of complementary data lines. The sensing circuitry 250 can correspond to sensing circuitry 150 shown in FIG. 1A, for example. The sense amplifier 206 can be a sense amplifier such as sense amplifier 306 and the compute component 231 can be a compute component such as compute component 331 described below in connection with FIG. 3. Embodiments are not limited to the example sense amplifier 206. As an example, the sense amplifier 206 can be current-mode sense amplifier and/or single-ended sense amplifier, e.g., sense amplifier coupled to one data line. Also, embodiments of the present disclosure are not limited to a folded data line architecture such as that shown in FIGS. 2A and 2B.

As shown in FIG. 2B, the sense amplifier 206 and the compute component 231 can be coupled to the array 230 via shift circuitry 223. In this example, the shift circuitry 223 comprises a pair of isolation devices 221-1 and 221-2, e.g., isolation transistors 221-1 and 221-2, coupled to data lines 205-1 (D) and 205-2 (D_), respectively. The isolation transistors 221-1 and 221-2 are coupled to a control signal 222 (NORM) that, when activated, enables, e.g., turns on, the isolation transistors 221-1 and 221-2 to couple the corresponding sense amplifier 206 and compute component 231 to a corresponding column of memory cells, e.g., to a corresponding pair of complementary data lines 205-1 (D) and 205-2 (D_). According to various embodiments, conduction of isolation transistors 221-1 and 221-2 can be referred to as a "normal" configuration of the shift circuitry 223.

In the example illustrated in FIG. 2B, the shift circuitry 223 includes another, e.g., a second, pair of isolation devices, e.g., transistors 221-3 and 221-4, coupled to a complementary control signal 219 (SHIFT), which can be activated, for example, when NORM is deactivated. The isolation transistors 221-3 and 221-4 can be operated, e.g., via control signal 219, such that a particular sense amplifier 206 and compute component 231 are coupled to a different pair of complementary data lines, e.g., a pair of complementary data lines different than the pair of complementary data lines to which isolation transistors 221-1 and 221-2 couple the particular sense amplifier 206 and compute component 231. In some embodiments, the isolation transistors 221-3 and 221-4 can be operated to couple a particular sense amplifier 206 and compute component 231 to another memory array (and isolate the particular sense amplifier 206 and compute component 231 from a first memory array). In various embodiments, the shift circuitry 223 may be arranged as a portion of, e.g., within, the sense amplifier 206 and/or compute component 231, for instance.

The shift circuitry 223 shown in FIG. 2B includes isolation transistors 221-1 and 221-2 used to couple particular sensing circuitry 250, e.g., a particular sense amplifier 206 and corresponding compute component 231, to a particular pair of complementary data lines 205-1 (D) and 205-2 (D_), e.g., DIGIT(n) and DIGIT(n)_), and isolation transistors 221-3 and 221-4 are arranged to couple the particular sensing circuitry 250 to an adjacent pair of complementary data lines in one particular direction, e.g., adjacent data lines DIGIT(n+1) and DIGIT(n+1)_ shown to the right in FIG. 2B. However, embodiments of the present disclosure are not so limited. For instance, shift circuitry can include isolation transistors 221-1 and 221-2 used to couple particular sensing circuitry to a particular pair of complementary data lines, e.g., DIGIT(n) and DIGIT(n)_, and isolation transistors 221-3 and 221-4 arranged to be used to couple the particular sensing circuitry to an adjacent pair of complementary data lines in another particular direction, e.g., adjacent data lines DIGIT(n−1) and DIGIT(n−1)_ shown to the left in FIG. 2B.

As such, the shift circuitry just described may be utilized to perform single-bit shift operations to shift a data value, e.g., from left to right or from right to left in a row, by a single bit, e.g., per clock cycle, from one memory cell to an adjacent memory cell in the row. Embodiments of single-bit shift circuitry are not limited to the configuration of shift circuitry 223 shown in FIG. 2B.

As described herein, a memory device, e.g., 120 in FIG. 1A, can be configured to couple to a host, e.g., 110, via a data bus, e.g., 156, and a control bus, e.g., 154. A bank section in the memory device, e.g., 123 in FIG. 1B, can include an array of memory cells, e.g., 130 in FIG. 1A, and sensing circuitry, e.g., 150 in FIG. 1A, coupled to the array via a plurality of sense lines, e.g., 205-1 and 205-2 in FIGS. 2A and 2B and at corresponding reference numbers in FIGS. 3, 4A, and 4B. The sensing circuitry can include a sense amplifier and/or a compute component, e.g., 206 and 231, respectively, in FIGS. 2A and 2B and at corresponding reference numbers in FIGS. 3, 4A, and 4B, coupled to a sense line and configured to implement operations on pitch with the memory cells of the array, as described herein. A controller, e.g., 140, in the memory device can be configured to couple to the array and sensing circuitry. A shared I/O line, e.g., 155 in FIG. 1C, 355 in FIG. 3, and 455-0 and 455-M−1 in FIGS. 4A and 4B, in the memory device can be configured to couple a source location, e.g., subarray 0 (425-0) in FIGS. 4A and 4B, and a destination location, e.g., subarray N−1 (425-N−1) in FIGS. 4A and 4B, between a pair of bank section locations.

As described herein, the array of memory cells can include an implementation of DRAM memory cells where the controller is configured, in response to a command, to use DRAM logical and electrical interfaces to move data from the source location to the destination location via a shared I/O line. According to various embodiments, the source location can be in a first bank and the destination location can be in a second bank in the memory device and the source location can be in a first subarray of one bank in the memory device and the destination location can be in a second subarray of the same bank. According to various embodiments, the first subarray and the second subarray can be in the same section of the bank or the subarrays can be in different sections of the bank.

According to various embodiments described herein, the apparatus can be configured to move data from a source location, including a particular row, e.g., 319 in FIG. 3, and column address associated with a first number of sense amplifiers and/or compute components, e.g., 406-0 and 431-0, respectively, in subarray 0 (425-0), to a shared I/O line, e.g., 455-0. In addition, the apparatus can be configured to move the data to a destination location, including a particular row and column address associated with a second number of sense amplifiers and/or compute components, e.g., 406-0 and 431-0, respectively, in subarray N−1 (425-N−1), using the shared I/O line, e.g., 455-0. As the reader will appreciate, each shared I/O line, e.g., 455-0, can actually include a complementary pair of shared I/O lines, e.g., shared I/O line and shared I/O line* as shown in the example configuration of FIG. 3. In some embodiments described herein, 2048 shared I/O lines, e.g., complementary pairs of shared I/O lines, can be configured as a 2048 bit wide shared I/O line.

FIG. 3 is a schematic diagram illustrating a portion of circuitry configured for a data shift operation between shared I/O lines in accordance with a number of embodiments of the present disclosure. FIG. 3 shows eight sense amplifiers, e.g., sense amplifiers 0, 1, . . . , 7 shown at 306-0, 306-1, . . . , 306-7, respectively, each coupled to a pair of complementary sense lines, e.g., digit lines 305-1 and 305-2. FIG. 3 also shows eight compute components, e.g., compute components 0, 1, . . . , 7 shown at 331-0, 331-1, . . . , 331-7, each coupled to a sense amplifier, e.g., as shown for sense amplifier 0 306-0, via pass gates and digit lines 307-1 and 307-2. For example, the pass gates can be connected as shown in FIG. 2A and can be controlled by an operation selection signal, Pass. For example, an output of the selection logic can be coupled to the gates of the pass gates and digit lines 307-1 and 307-2. Corresponding pairs of the sense amplifiers and compute components can, in some embodiments, contribute to formation of the sensing circuitry indicated at 350-0, 350-1, . . . , 350-7.

Data values present on the pair of complementary digit lines 305-1 and 305-2 can be loaded into the compute component 331-0 as described in connection with FIGS. 2A and 2B. For example, when the pass gates are open, data values on the pair of complementary digit lines 305-1 and 305-2 can be passed from the sense amplifiers to the compute component, e.g., 306-0 to 331-0. The data values on the pair of complementary digit lines 305-1 and 305-2 can be the data value stored in the sense amplifier 306-0 when the sense amplifier is fired.

The sense amplifiers 306-0, 306-1, . . . , 306-7 in FIG. 3 can each correspond to sense amplifier 206 shown in FIGS. 2A and 2B. The compute components 331-0, 331-1, . . . , 331-7 shown in FIG. 3 can each correspond to compute component 231 shown in FIGS. 2A and 2B. A combination of one sense amplifier with one compute component can, in some embodiments, contribute to the sensing circuitry, e.g., 350-0, 350-1, . . . , 350-7, of a portion of a DRAM memory subarray 325 configured to couple to a shared I/O line 355, as described herein. The paired combinations of the sense amplifiers 306-0, 306-1, . . . , 306-7 and the compute components 331-0, 331-1, . . . , 331-7, shown in FIG. 3, can be included in a sensing component stripe, as shown at 124 in FIG. 1B and at 424 in FIGS. 4A and 4B. However, embodiments are not so limited. For example, in some embodiments, there may not be a 1:1 correlation between the number of sense amplifiers and compute components. For example, there may be more than one sense amplifier per compute component or more than one compute component per sense amplifier, which may vary between sections, banks, etc. In some embodiments, the sensing circuitry may only include sense amplifiers or compute components, e.g., sense amplifiers and not compute components or vice versa.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry, e.g., rather than being at either end of the combination of the sense amplifiers and the compute components.

The circuitry illustrated in FIG. 3 also shows column select circuitry 358-1, 358-2 that is configured to implement data movement, shift, and/or rotation operations on particular columns 322 of a subarray 325 and the complementary digit lines 305-1 and 305-2 thereof, e.g., as directed by the controller 140 shown in FIGS. 1A, 1B, and 1C, coupling sensed data values to the shared I/O line 355. For example, column select circuitry 358-1 has select lines 0, 2, 4, and 6 that are configured to couple with corresponding columns, such as column 0 (332-0), column 2, column 4, and column 6. Column select circuitry 358-2 has select lines 1, 3, 5, and 7 that are configured to couple with corresponding columns, such as column 1, column 3, column 5, and column 7.

Controller 140 can be coupled to column select circuitry 358 to control select lines, e.g., select line 1, to access data values stored in the sense amplifiers, compute components and/or present on the pair of complementary digit lines, e.g., 305-1 and 305-2 when selection transistors 359-1, 359-2 are enabled via signals from column select line 0. Opening the selection transistors 359-1, 359-2, e.g., as directed by the controller 140, enables coupling of sense amplifier 306-0 and/or compute component 331-0 to couple with complementary digit lines 305-1 and 305-2 of column 322-0 to move data values on digit line 0 and digit line 0* for a particular row 319 stored in sense amplifier 306-0 and/or compute component 331-0. Data values from rows in each of columns 0 through 7 can similarly be selected by controller 140 coupling, via an appropriate select line, a particular combination of a sense amplifier and a compute component with a pair of complementary digit lines by opening the appropriate selection transistors.

Moreover, opening the selection transistors, e.g., selection transistors 359-1, 359-2, enables a particular sense amplifier and/or compute component, e.g., 306-0 and/or 331-0, to be coupled with a shared I/O line 355 such that the sensed (stored) data values can be placed on, e.g., transferred to, the shared I/O line 355. In some embodiments, one column at a time is selected, e.g., column 322-0, to be coupled to a particular shared I/O line 355 to move, e.g., transfer, the sensed data values. In the example configuration of FIG. 3, the shared I/O line 355 is illustrated as a shared, differential I/O line pair, e.g., shared I/O line and shared I/O line*. Hence, selection of column 322-0 could yield two data values, e.g., two bits with values of 0 and/or 1, from a row, e.g., 319, stored in the sense amplifier and/or compute component associated with complementary digit lines 305-1 and 305-2. These data values could be input in parallel to each of the shared differential I/O pair, e.g., shared I/O and shared I/O* lines, of the shared I/O line 355. However, embodiments are not so limited.

As described in more detail in connection with FIGS. 5, 6A, 6B, 7A, and 7B, the shared I/O line 355 may have shift element 0, as shown at 332-0, and shift element 1, as shown at 332-1, positioned toward opposite ends of the shared I/O line 355 relative to what is illustrated in FIG. 3 as the top and bottom of subarray 325. For example, shift element 332-0 may be positioned, e.g., formed, in the vicinity of sensing circuitry indicated at 350-0, 350-2, . . . , 350-6 and shift element 332-1 may be positioned, e.g., formed, in the vicinity of sensing circuitry indicated at 350-1, 350-3, . . . , 350-7. Shift element 332-1, e.g., latch 535-1 thereof, as shown in and described in connection with FIG. 5, may be selectably coupled to the shared I/O line 355 at node 334-1. The shift element 332-1 may be selectably coupled to the shared I/O line 355 at node 334-1 via connection circuitry 333-1-1 and the shift element 332-1 may be selectably coupled to other shared I/O lines, e.g., as described in connection with FIGS. 5, 6A, 6B, 7A, and 7B, via connection circuitry 333-1-0 and 331-1-2. Similarly, shift element 332-0 may be selectably coupled to the shared I/O line 355 at node 334-0 via connection circuitry 333-0-1 and selectably coupled to other shared I/O lines via connection circuitry 333-0-0 and 331-0-2.

Shift elements 332-0 and 332-1 are illustrated at respective ends of shared I/O line 355 for purposes of clarity. However, embodiments are not so limited. For example, in various embodiments, the two shift elements selectably coupled to each portion of a shared I/O line associated with a subarray, partition, bank, etc., may be positioned toward the respective ends rather than at the respective ends. Being positioned toward the respective ends is shown in FIGS. 6A and 6B and 7A and 7B by the two shift elements, e.g., 632-0-0 and 632-1-0, being respectively positioned to the left and to the right relative to a middle region of the shared I/O line indicated by a dashed line. In some embodiments, as described further herein, the two shift elements selectably coupled to each portion of the shared I/O line may both be positioned at or toward the same end of the subarray, partition, bank, etc.

In some embodiments, the shift elements may be circuitry that is included in the sensing circuitry 350-0, 350-1, . . . , 350-7. The shift elements may be positioned, e.g., formed, separate from the sensing circuitry in some embodiments. For example, the shift element and/or associated circuitry shown in and described in connection with FIG. 5 may be positioned, e.g., formed, on pitch with the sense lines and the memory cells of the array, e.g., by being formed between the shared I/O lines, sensing circuitry, etc. In some embodiments, the shift elements and/or associated circuitry may be positioned, e.g., formed, on chip with, however, on a different plane from, e.g., above, the number of shared I/O lines, sensing circuitry, and/or memory cells of the array.

Figure 5:
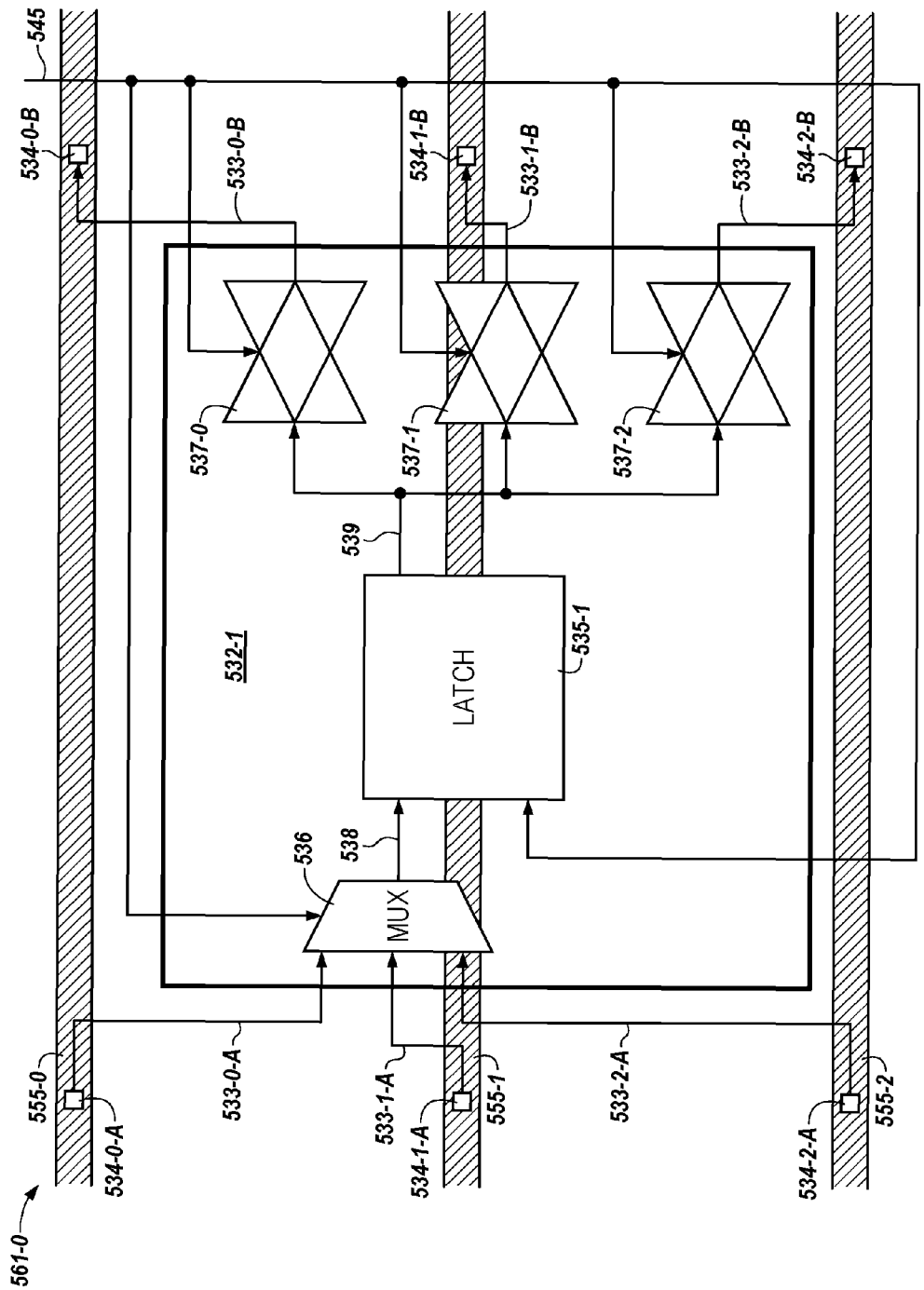
FIG. 5 is a schematic diagram illustrating circuitry of a shift element of a memory device in accordance with a number of embodiments of the present disclosure.
Figure 6A:
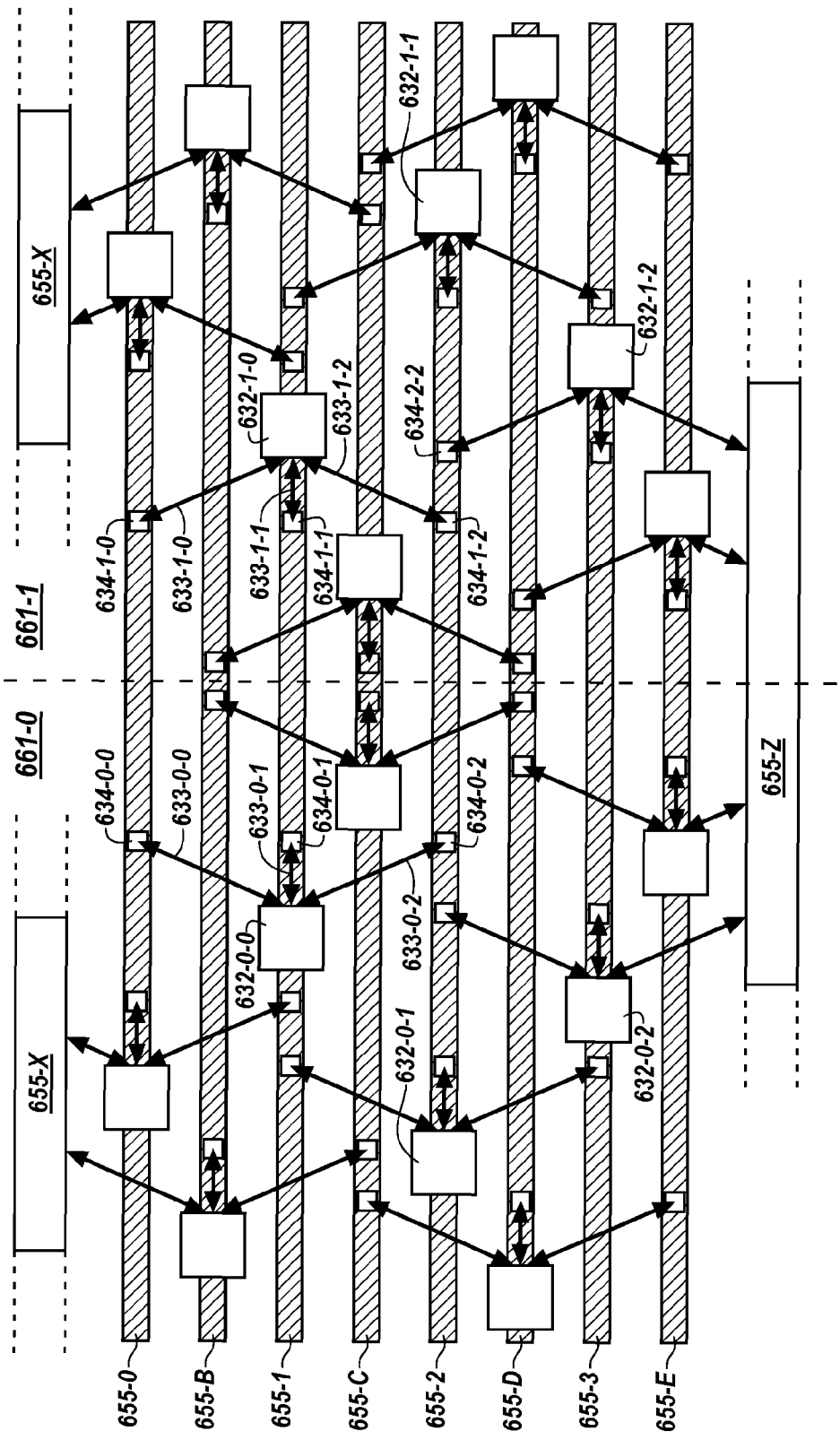
FIG. 6A is a schematic diagram illustrating an example of circuitry configured for a data shift operation in a memory device in accordance with a number of embodiments of the present disclosure.

As described herein, a first shift element, e.g., 332-0 in FIG. 3, 532-1 in FIG. 5, and/or 633-0-1 in FIG. 6A, in some embodiments may be configured to couple a first shared I/O line, e.g., 355 in FIG. 3, 555-0 in FIG. 5, and/or 655-0 in FIG. 6A, at a first node, e.g., 334-0 in FIG. 3, 534-0-A in FIG. 5, and/or 634-0-0 in FIG. 6A, via first connection circuitry, e.g., 333-0-1 in FIG. 3, 533-0-A, and/or 633-0-0 in FIG. 6A. A second shift element, e.g., 332-1 in FIG. 3 and/or 632-1-0 in FIG. 6A, in some embodiments may be configured to couple a second shared I/O line, e.g., 555-2 in FIG. 5 and/or 655-2 in FIG. 6A, via second connection circuitry, e.g., 333-1-2 in FIG. 3, 533-2-B in FIG. 5, and/or 633-1-2 in FIG. 6A, to couple the second shared I/O line at a second node, e.g., 534-2-B in FIG. 5 and/or 634-1-2 in FIG. 6A.

The controller 140 described herein may be coupled to a memory device and may be configured to direct a data shift operation. As described herein, the memory device can include an array, e.g., 130, of memory cells and sensing circuitry, e.g., 150, coupled to the array via a plurality of columns, e.g., 122, of the memory cells. The sensing circuitry may include a sense amplifier, e.g., 206, and/or a compute component, e.g., 231, coupled to each of the columns and configured to implement a command from the controller to shift data values. The sensing circuitry may be configured to selectably couple a particular subset of sense lines, e.g., sense lines 305-1 and 305-2 for columns 322 shown in FIG. 3, to a particular shared I/O line, e.g., shared I/O line 355, in order to implement the data shift operation. The controller 140 may be further configured to direct selectable coupling of the array, the sensing circuitry, and one or more shift elements, e.g., 332, to enable a shift of a data value from a first shared I/O line to the second shared I/O line, e.g., from shared I/O line 455-0 to shared I/O line 455-M-1 shown in and described in connection with FIGS. 4A and 4B.

FIGS. 4A and 4B provide another schematic diagram illustrating circuitry configured for a data shift operation between portions of a memory device via shared I/O lines in accordance with a number of embodiments of the present disclosure. As illustrated in FIGS. 1B and 1C and shown in more detail in FIGS. 4A and 4B, a bank section of a DRAM memory device can include a plurality of subarrays, which are indicated in FIGS. 4A and 4B at 425-0 as subarray 0 and at 425-N-1 as subarray N-1.

FIGS. 4A and 4B, which are to be considered as horizontally connected, illustrate that each subarray, e.g., subarray 0 425-0 partly shown in FIG. 4A and partly shown in FIG. 4B, can have a number of associated sense amplifiers 406-0, 406-1, . . . , 406-X-1 and/or compute components 431-0, 431-1, . . . , 431-X-1. For example, each subarray, 425-0, . . . , 425-N-1, can have one or more associated sensing component stripes, e.g., 124-0, . . . , 124-N-1 as shown in FIG. 1B. As described herein, each subarray, 425-0, . . . , 425-N-1, can be split into portions 462-0, as shown in FIG. 4A, 462-1, . . . , 462-M-1, as shown in FIG. 4B. The portions 462-0, . . . , 462-M-1 may be defined by configuring a predetermined number of the sense amplifiers and/or compute components, e.g., sensing circuitry 450, along with the corresponding columns, e.g., 422-0, 422-1, . . . , 422-7, among columns 422-0, . . . , 422-X-1, to selectably couple to a given shared I/O line, e.g., 455-M-1. Corresponding pairs of the sense amplifiers and compute components may contribute to formation of the sensing circuitry indicated at 450-0, 450-1, . . . , 450-X-1 in FIGS. 4A and 4B.

In some embodiments, as shown in FIGS. 3, 4A, and 4B, the predetermined number of the sense amplifiers and/or compute components, along with the corresponding columns, configured to selectably couple per shared I/O line may be eight. The number of portions 462-0, 462-1, . . . , 462-M-1 of the subarray can be the same as the number of shared I/O lines 455-0, 455-1, . . . , 455-M-1 configured to couple to the subarray. The subarrays can be arranged according to various DRAM architectures for coupling the shared I/O lines 455-0, 455-1, . . . , 455-M-1 between subarrays 425-0, 425-1, . . . , 425-N-1.

For example, portion 462-0 of subarray 425-0 in FIG. 4A can correspond to the portion of the subarray illustrated in FIG. 3. As such, sense amplifier 406-0 and/or compute component 431-0 can be coupled to column 422-0. As described herein, a column can be configured to include a pair of complementary digit lines referred to as digit line 0 and digit line 0*. However, alternative embodiments can include a single digit line 405-0 (sense line) for a single column of memory cells. Embodiments are not so limited.

As illustrated in FIGS. 1B and 1C and shown in more detail in FIGS. 4A and 4B, a sensing component stripe can, in various embodiments, extend from one end of a subarray to an opposite end of the subarray. For example, as shown for subarray 425-0, sensing component stripe 424-0, shown schematically above and below DRAM columns in a folded sense line architecture) may include and extend from sense amplifier 406-0 and compute component 431-0 in portion 462-0 to sense amplifier 406-X-1 and compute component 431-X-1 in portion 462-M-1 of subarray 425-0.

As described in connection with FIG. 3, the configuration illustrated in FIGS. 4A and 4B for the sense amplifiers 406-0, 406-1, . . . , 406-X-1 in combination with the compute components 431-0, 431-1, . . . , 431-X-1 and shared I/O line 455-0 through shared I/O 455-M-1 is not limited to half the combination of the sense amplifiers with the compute components of the sensing circuitry, e.g., 450, being formed above the columns of memory cells and half being formed below the columns of memory cells 422-0, 422-1, . . . , 422-X-1 in a folded DRAM architecture. For example, in various embodiments, a sensing component stripe 424 for a particular subarray 425 can be formed with any number of the sense amplifiers and/or compute components of the sensing amplifier stripe being formed above and below the columns of memory cells. Accordingly, in some embodiments as illustrated in FIGS. 1B and 1C, all of the sense amplifiers and/or compute components of the sensing circuitry and corresponding sensing amplifier stripes can be formed above or below the columns of memory cells.

As described in connection with FIG. 3, each subarray can have column select circuitry, e.g., as shown at 358 in FIG. 3, that is configured to implement data movement, shifting, and/or rotation operations on particular columns 422 of a subarray, such as subarray 425-0, and the complementary digit lines thereof, coupling stored data values from the sense amplifiers 406 and/or compute components 431 to given shared I/O lines 455-0, . . . , 455-M-1, e.g., complementary shared I/O lines 355 in FIG. 3. The controller 140 may direct that data values of memory cells in a particular row, e.g., row 319, of subarray 425-0 be sensed and moved to a same or different numbered row of subarray 425-N-1 in a same or different numbered column. For example, a data value may be moved, shifted, and/or rotated to different portions of the two subarrays, e.g., not necessarily from portion 462-0 of subarray 425-0 to portion 462-1 of subarray 425-1 or from portion 462-0 of subarray 425-0 to portion 462-0 of subarray N-1. In some embodiments data values may be shifted from a column in portion 462-0 to a column in portion 462-M-1 using shifting techniques described herein.

The column select circuitry, e.g., 358 in FIG. 3, can direct movement, e.g., sequential movement, of data values from each of the eight columns, e.g., digit/digit*, in the portion, e.g., 462-0, of the subarray, e.g., 425-0, for a particular row such that the sense amplifiers and/or compute components of the sensing component stripe, e.g., 424-0, for that portion can store (cache) and move all data values to the shared I/O line in a particular order, e.g., in an order in which the columns were sensed. With complementary digit lines, such as digit/digit*, and complementary shared I/O lines 355, for each of eight columns, there can be 16 data values, e.g., bits, sequenced to the shared I/O line from one portion of the subarray such that one data value, e.g., bit, is input to each of the complementary shared I/O lines at a time from each of the sense amplifiers and/or compute components.

As such, with 2048 portions of subarrays each having eight columns, e.g., subarray portion 462-0 of each of subarrays 425-0, 425-1, . . . , 425-N-1, and each configured to couple to a different shared I/O line, e.g., 455-0 through 455-M-1, 2048 data values, e.g., bits, could be moved to the plurality of shared I/O lines at substantially the same point in time, e.g., in parallel. Accordingly, the present disclosure describes configuring the plurality of shared I/O lines to be at least a thousand bits wide, e.g., 2048 bits wide, to increase the speed, rate, and efficiency of data movement, shifting, and/or rotation in a DRAM implementation, e.g., relative to a 64 bit wide data path.

As illustrated in FIGS. 4A and 4B, in each subarray, e.g., subarray 425-0, one or more multiplexers 460-0, 460-1 can be coupled to the sense amplifiers and/or compute components of each portion 462-0, 462-1, . . . , 462-M−1 of the sensing component stripe 424-0 for the subarray. The multiplexers 460-0, 460-1 can be configured to access, select, receive, coordinate, combine, and transport the data values, e.g., bits, stored (cached) by the number of selected sense amplifiers and/or compute components in a portion, e.g., portion 462-0, of the subarray to be input to the shared I/O line, e.g., shared I/O line 455-0. As such, a shared I/O line, as described herein, can be configured to couple a source location and a destination location between a pair of bank section locations for improved data movement.

According to various embodiments of the present disclosure, a controller, e.g., 140, can be coupled to a bank of a memory device, e.g., 121, to execute a command to move data in the bank from a source location, e.g., subarray 0 425-0, to a destination location, e.g., subarray N−1 425-N−1. A bank section can, in various embodiments, include a plurality of subarrays of memory cells in the bank section, e.g., subarrays 125-0 through 125-N−1 and 425-0 through 425-N−1. The bank section can, in various embodiments, further include sensing circuitry, e.g., 150, coupled to the plurality of subarrays via a plurality of columns, e.g., 322-0 and 422-0 and 422-1, of the memory cells. The sensing circuitry can include a sense amplifier and/or a compute component, e.g., 206 and 231, respectively, in FIGS. 2A and 2B and at corresponding reference numbers in FIGS. 3, 4A, and 4B, coupled to each of the columns and configured to implement the command to move the data.

The bank section can, in various embodiments, further include a shared I/O line, e.g., 155, 355, and 455-0 and 455-M−1, to couple the source location and the destination location to move the data. In addition, the controller can be configured to couple to the plurality of subarrays and to the sensing circuitry to perform a data write operation on the moved data to the destination location, e.g., in the bank section.

As such, the controller 140 can be configured to direct writing of the data, moved via the shared I/O lines, to particular memory cells in the destination location, e.g., to memory cells in a particular row of a subarray. Performing a data write operation as such on the moved data can be in addition to the alternative pathway, e.g., as shown in FIG. 1A, of the controller 140 being configured to direct writing of data to the memory array 130, where the data is transferred from the host 110 over the data bus 156, e.g., a 64 bit wide data bus, via the I/O circuitry 144 and the write circuitry 148.

According to various embodiments, the apparatus can include a sensing component stripe, e.g., 124 and 424, configured to include a number of a plurality of sense amplifiers and/or compute components that corresponds to a number of the plurality of columns of the memory cells, e.g., where each column of memory cells is configured to couple to a sense amplifier and/or a compute component. The number of a plurality of sensing component stripes in the bank section, e.g., 424-0 through 424-N−1, can correspond to a number of a plurality of subarrays in the bank section, e.g., 425-0 through 425-N−1.

The number of sense amplifiers and/or compute components can be configured to be selectably, e.g., sequentially, coupled to the shared I/O line, e.g., as shown by column select circuitry at 358-1, 358-2, 359-1, and 359-2 in FIG. 3. The column select circuitry can be configured to selectably sense data in a particular column of memory cells of a subarray by being selectably coupled to, for example, eight sense amplifiers and/or compute components in the source location, e.g., as shown in subarray 325 in FIG. 3 and subarray portions 462-0 through 462-M−1 in FIGS. 4A and 4B. As such, the eight sense amplifiers and/or compute components in the source location can be configured to sequentially couple to the shared I/O line. According to the embodiments described herein, a number of shared I/O lines formed in the array can be configured by division of a number of columns in the array by the eight sense amplifiers and/or compute components coupled to each of the shared I/O lines. For example, when there are 16,384 columns in the array, e.g., bank section, or in each subarray thereof, and one sense amplifier and/or compute component per column, 16,384 columns divided by eight yields 2048 shared I/O lines.

In various embodiments, data from different selected rows, e.g., as shown at 319 and described in connection with FIG. 3, may be moved, e.g., shifted and/or rotated, the same number or different numbers of shared I/O lines depending on a control signal from the controller. For example, data from any row of a portion of an array and/or subarray may be selectably sent via a coupled shared I/O line to any selected one of a plurality of coupled shared I/O lines, e.g., to be shifted and/or rotated to the destination location. When a shift operation of a selected number of spans and/or single-bit shifts would result in data values being shifted past one end of a subarray, e.g., past the 16,384 columns, a rotate operation may be performed to move the data values to columns at an opposite end of the subarray. For example, memory cells selectably coupled to the columns associated particular shared I/O lines may have been previously cleared by the shift operation. As such, in a block of data values to be moved, some of the data values in the block may be shifted toward the one end of the subarray and some may be rotated to the opposite end of the subarray.

In some embodiments, some data values in a block of data values may be moved via the associated shared I/O lines in one direction, e.g., toward shared I/O line 655-0 in FIG. 6, and other data values, e.g., a remainder of the data values, in the block may be moved via the associated shared I/O lines in an opposite direction, e.g., toward shared I/O line 655-E in FIG. 6. As an alternative or in addition, a number of data values may be retained, e.g., stored, in respective shift elements to which the data values have been moved rather than or in addition to being shifted and/or rotated.

The apparatus can, in various embodiments, include a number of multiplexers, e.g., as shown at 460-0 and 460-1, in portions 462-0 through 462-M−1 of various subarrays in FIGS. 4A and 4B. In some embodiments, the column select circuitry shown at 358-1, 358-2, 359-1, and 359-2 in FIG. 3 can correspond to and represent at least a portion of the functionality embodied by and contained in the multiplexers shown at 460-0 and 460-1 in FIGS. 4A and 4B. As such, according to various embodiments, the apparatus can include a plurality of sense amplifiers and/or compute components and a multiplexer to select a sense amplifier and/or a compute component to couple to the shared I/O line. The multiplexers can be formed between the sense amplifiers and/or compute components and the shared I/O line to access, select, receive, coordinate, combine, and transport selected data to be input to the coupled shared I/O line.

As described herein, an array of memory cells can include a column of memory cells having a pair of complementary sense (digit) lines, e.g., 305-1 and 305-2 in FIG. 3. The sensing circuitry can, in some embodiments, include a sense amplifier, e.g., 306-0, selectably coupled to each of the pair of complementary sense (digit) lines and a compute component, e.g., 331-0, coupled to the sense amplifier via pass gates, e.g., 307-1, 307-2.

According to some embodiments, a source sensing component stripe, e.g., 124 and 424, can include a number of sense amplifiers and/or compute components that can be selected and configured to send an amount of data, e.g., a number of bits, sensed from a row of the source location in parallel to a plurality of shared I/O lines. For example, in response to control signals for sequential sensing through the column select circuitry, the memory cells of selected columns of a row of the subarray can sense and store (cache) an amount of data, e.g., the number of bits, until that amount reaches a threshold and then send the data via the plurality of shared I/O lines. In some embodiments, the threshold amount of data can correspond to the at least a thousand bit width of the plurality of shared I/O lines.

The controller can, as described herein, be configured to move, shift, and/or rotate the data from a selected portion of a row and a selected sense line in the source location to another selected portion of the row and a selected sense line in the destination location via the shared I/O lines, e.g., in response to control signals from the controller 140, via the data shift circuitry described herein, e.g., as shown in particular in and described in connection with FIGS. 3, 5, 6A, 6B, 7A, and 7B. In various embodiments, a selected portion of a row and a selected sense line in the source location, e.g., portion 462-0 of subarray 425-0, input to the controller can be different from a selected portion of the row and a selected sense line in the destination location, e.g., portion 462-M−1 of subarray 425-0.

As described herein, a destination sensing component stripe, e.g., 124 and 424, can be the same as a source sensing component stripe. For example, a plurality of sense amplifiers and/or compute components can be selected and configured, e.g., depending on the control signal from the controller, to selectably send sensed data to the coupled shared I/O line and selectably receive the data from one of a plurality of coupled shared I/O lines, e.g., to be moved, shifted, and/or rotated to the destination location. Selection of sense amplifiers and/or compute components in the destination sensing component stripe can be performed using the column select circuitry described herein, e.g., 358-1, 358-2, 359-1, and 359-2 shown in FIG. 3.

The controller can, according to some embodiments, be configured to write an amount of data, e.g., a number of data bits, selectably received by the plurality of selected sense amplifiers and/or compute components in the destination sensing component stripe to a selected portion of a row and a selected sense line of the destination location in the destination subarray. In some embodiments, the amount of data to write corresponds to the at least a thousand bit width of a plurality of shared I/O lines.

FIG. 5 is a schematic diagram illustrating circuitry of a shift element of a memory device in accordance with a number of embodiments of the present disclosure. The shift element 532-1 illustrated in FIG. 5 may represent and/or be included in data shift circuitry 561-0 and may represent at least a portion of the functionality embodied by and contained in the shift elements 332 shown in FIG. 3, shift elements 632 shown in FIGS. 6A and 6B, and/or shift elements 732 and 772 shown in FIGS. 7A and 7B. For example, shift element 532-1 may represent one of a pair of shift elements located in association with subarray 325 and selectably coupled to shared I/O line 355 in FIG. 3, associated with one of subarrays 425-0, 425-1, . . . , 425-M−1 selectably coupled to respective shared I/O lines 455-0, 455-1, . . . , 455-M−1 in FIGS. 4A and 4B, and/or associated with a memory array selectably coupled to shared I/O lines 655 and/or 755 in FIGS. 6A and 6B and 7A and 7B.

FIG. 5 shows an example of a shift element 532-1 of the data shift circuitry 561-0 in which a single latch 535-1 is utilized to store a number of data values utilized in read and/or write operations described herein. For example, latch 535-1 may be configured to store a single data value accessed from a single memory cell and sent by corresponding sensing circuitry via one of shared I/O lines 555-0, 555-1, and 555-2, which may correspond to the shared I/O lines having corresponding reference numbers shown in FIGS. 3, 4A, 4B, 6A, 6B, 7A, and 7B. However, embodiments are not so limited. For example, some embodiments may include a plurality of various types of latches and/or various configurations of latches, which may be utilized to store a plurality of data values that may be utilized in the read and/or write operations described herein.

Latch 535-1 may be configured to selectably input 538 data values for storage from, in some embodiments, one of three associated shared IO lines 555-0, 555-1, and 555-2. The latch 535-1 may be positioned adjacent shared IO line 555-1 and selectably coupled to one of shared IO lines 555-0, 555-1, and 555-2 at a time by, in some embodiments, multiplexer (mux) 536. Although not shown in FIG. 5, shared I/O line 555-0 and shared I/O line 555-2 may each be separated from shared I/O line 555-1 positioned between them by at least one intervening shared I/O line, e.g., as shown in and described in connection with FIGS. 6A and 6B and 7A and 7B. In some embodiments, the latch 535-1 may be configured to selectably output 539 data values for movement, shifting, and/or rotating to one of the three associated shared IO lines 555-0, 555-1, and 555-2. The latch 535-1 may be selectably coupled to one of shared IO lines 555-0, 555-1, and 555-2 at a time for output of the data values by, in some embodiments, pass gates 537-0, 537-1, and 537-2 selectably coupled to the respective shared IO lines 555-0, 555-1, and 555-2.

As shown in FIG. 5, data values may be selectably input from shared IO lines 555-0, 555-1, and 555-2 via respective input nodes 534-0-A, 534-1-A, and 534-2-A coupled to input connection circuitry 533-0-A, 533-1-A, and 533-2-A that are selectably coupled to mux 536. Data values may be selectably output to shared IO lines 555-0, 555-1, and 555-2 via respective output connection circuitry 533-0-B, 533-1-B, and 533-2-B coupled to output nodes 534-0-B, 534-1-B, and 534-2-B that are selectably coupled to pass gates 537-0, 537-1, and 537-2.

However, embodiments are not so limited. For example, either of mux 536 circuitry and/or pass gates 537 may, in various embodiments, be utilized for input 538 and/or output 539 of the data values. In some embodiments, both the input 538 and/or output 539 of the data values may be performed by a single combination of mux 536 circuitry, a single combination of pass gates 537, and/or a single combination of a mixture of the two circuitries in order to occupy less chip area. Other embodiments of equivalent circuitry may be utilized for the same purpose without departing from the scope of the present disclosure.

As such, the latch 535-1 of the shift element 532-1 may be configured to receive a data value via a first shared I/O line and configured to send the data value via a second shared I/O line to perform the data shift operation. The various possible embodiments of the of mux 536 circuitry and/or the pass gates 537 may collectively be termed a "select element", where the select element may be configured to enable the data value to be selectably received from a particular first shared I/O line and selectably sent to a particular second shared I/O line. In various embodiments, the select element may include first select circuitry, e.g., mux 536 circuitry, configured to selectably receive a data value from a source location via a particular first shared I/O line, e.g., shared I/O line 555-0, selected from a plurality of shared I/O lines and second select circuitry, e.g., pass gates 537, configured to selectably send the data value to a destination location via a particular second shared I/O line, e.g., shared I/O line 555-2, selected from the plurality of shared I/O lines. As described herein, the first select circuitry may, in some embodiments, be pass gates 537 and the second select circuitry may be mux 536 circuitry, or vice versa, and/or the first select circuitry and the second select circuitry may be configured as a single combination of circuitry.

Input of control signals 545, e.g., from controller 140, may direct configuration of the mux 536 and/or the pass gate 537 circuitry to determine from which shared I/O line input 538 is to be written to the latch 535-1 and/or to which shared I/O line input 538 output 539 is to be read. Writing to the latch 535-1 may be enabled by setting control signal 545 inputs to the mux 536 associated with input 538 of data to the latch. Reading from the latch 535-1 may be enabled by setting control signal 545 inputs to one of the pass gates 537-0, 537-1, and 537-2 associated with output 539 of data from the latch. In some embodiments, the latch 535-1 may be configured such that only one read operation and/or write operation may be performed per clock cycle.

FIG. 6A is a schematic diagram illustrating an example of circuitry configured for a data shift operation in a memory device in accordance with a number of embodiments of the present disclosure. The shift elements 632 illustrated in FIGS. 6A and 6B and/or shift elements 732 illustrated in FIGS. 7A and 7B and associated connection circuitry may represent and/or be included in the data shift circuitry 561-0 illustrated in FIG. 5 and may represent at least a portion of the functionality embodied by and contained therein. For example, shift elements 632 and 732 each may represent one of a pair of shift elements. The one shift element of the pair may be located toward one end, e.g., end 661-0 and/or end 661-1 in FIGS. 6A and 6B and/or ends 761-0 or 761-1 in FIGS. 7A and 7B.

Figure 6B:
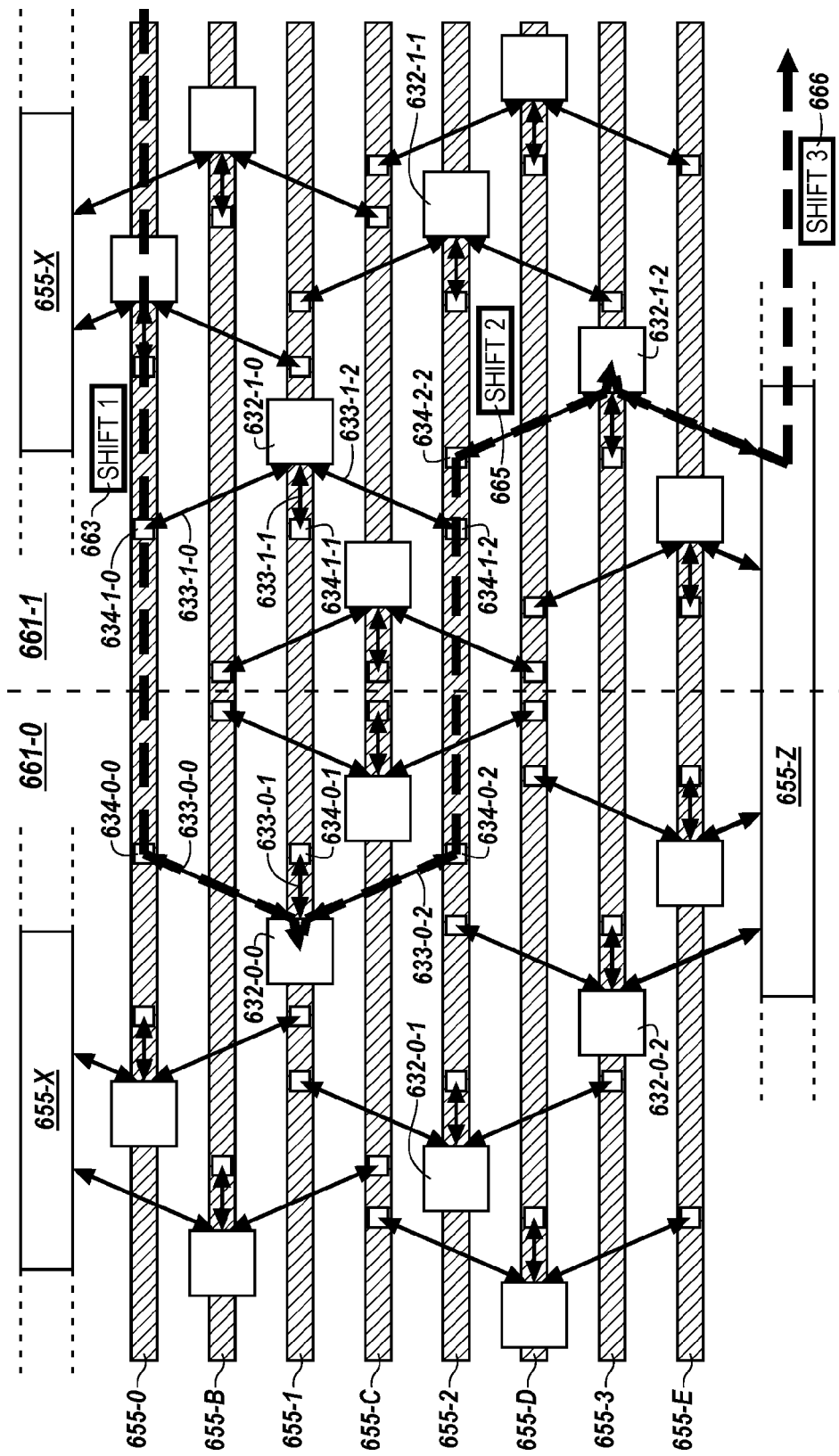
FIG. 6B is a schematic diagram illustrating an example of performance of a data shift operation in a memory device in accordance with a number of embodiments of the present disclosure.

For purposes of clarity, shift elements 632 and associated circuitry are illustrated in FIGS. 6A and 6B as being staggered in the respective ends 661-0, 661-1 of shared I/O lines 655 relative to a middle region of the shared I/O line indicated by a dashed line. However, embodiments are not so limited. For example, in various embodiments, the two shift elements selectably coupled to each portion of a shared I/O line associated with a subarray, partition, bank, etc., may be positioned at the respective ends, e.g., as shown in FIG. 3, rather than being in a staggered configuration toward the respective ends, e.g., as shown in FIGS. 6A and 6B and 7A and 7B.

Figure 7A:
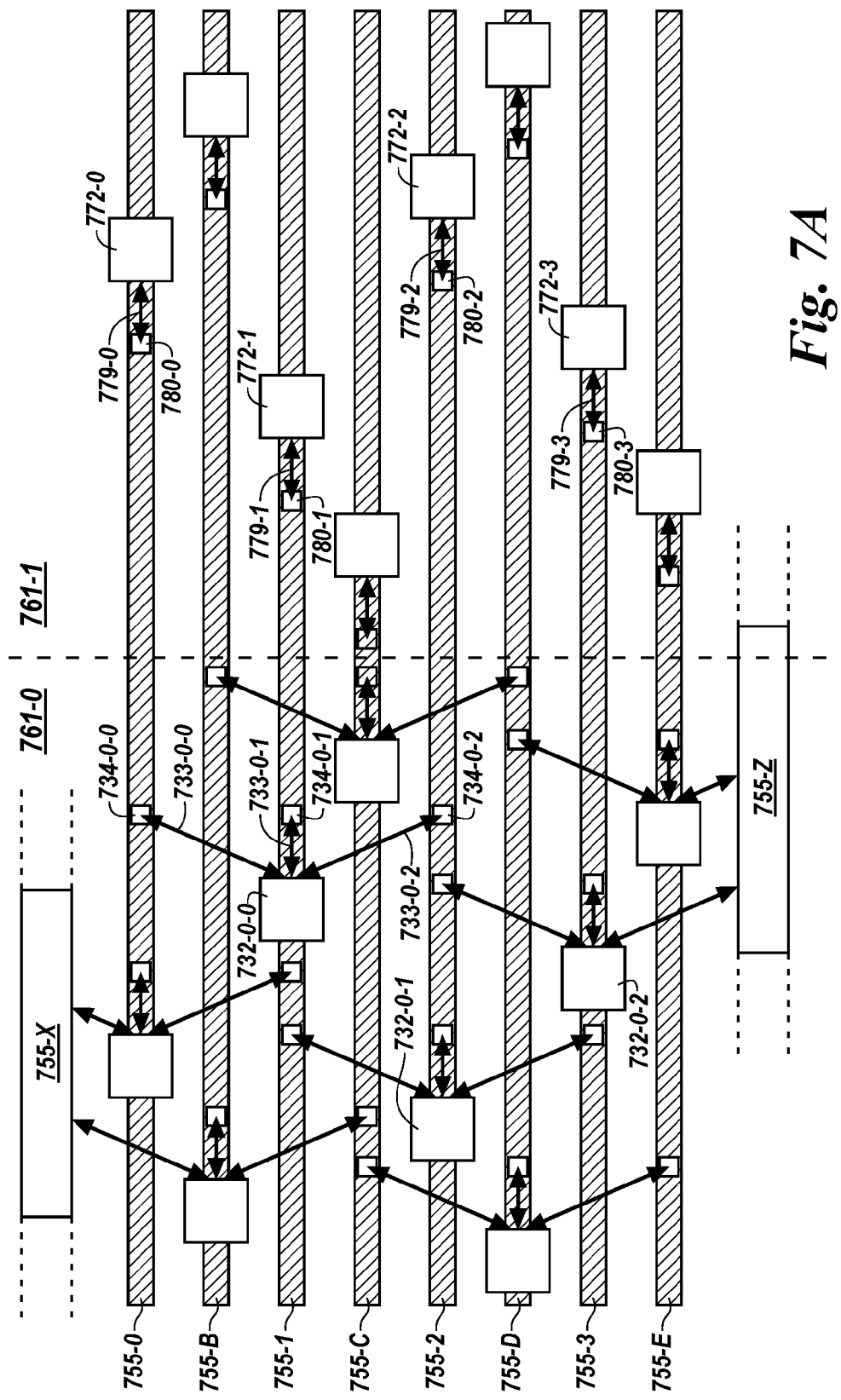
FIG. 7A is a schematic diagram illustrating another example of circuitry configured for a data shift operation in a memory device in accordance with a number of embodiments of the present disclosure.
Figure 7B:
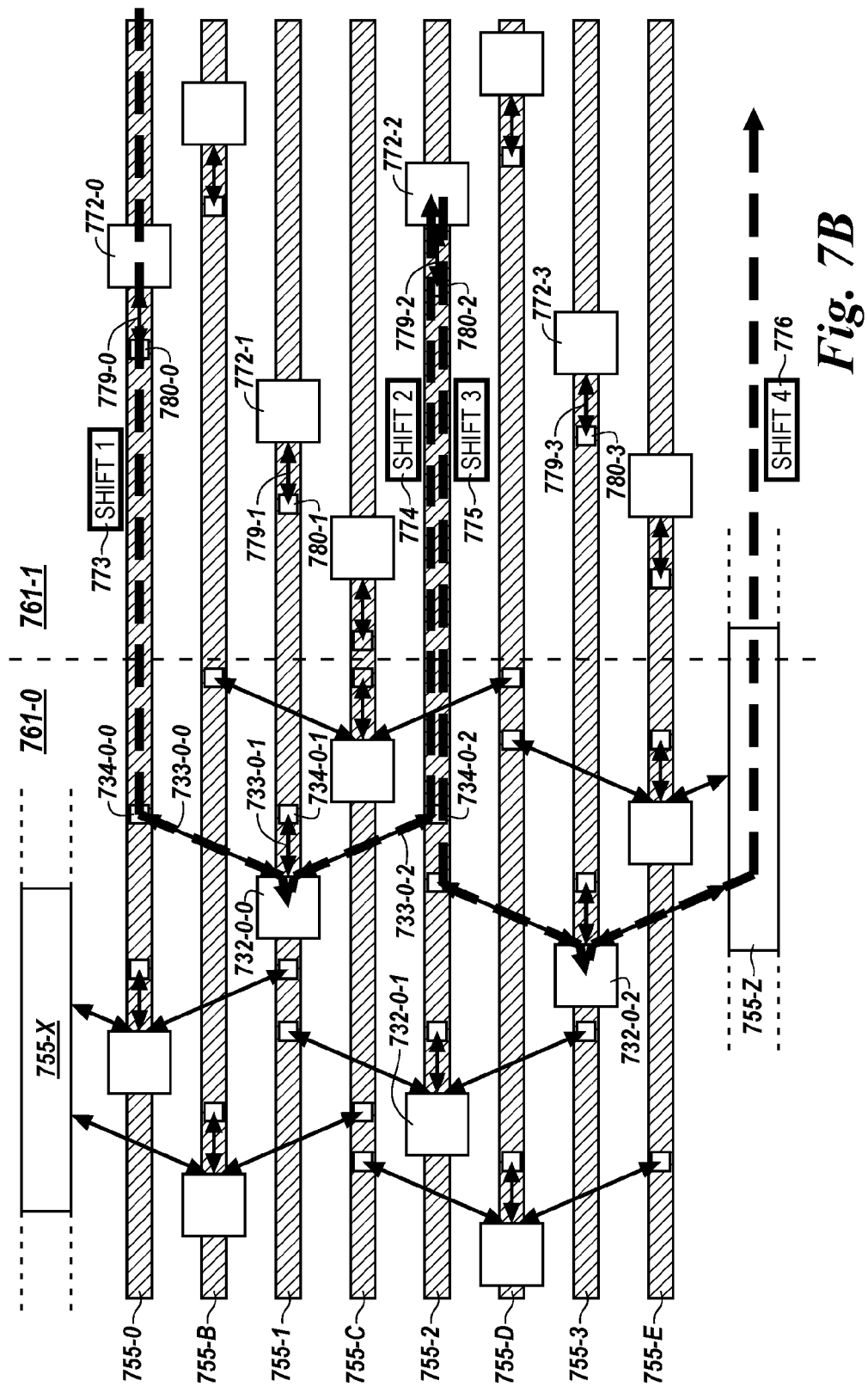
FIG. 7B is a schematic diagram illustrating another example of performance of a data shift operation in a memory device in accordance with a number of embodiments of the present disclosure.

The double-headed arrows connecting the shift elements 632 in FIGS. 6A and 6B and shift elements 632 and/or 772 in FIGS. 7A and 7B are intended to represent the bidirectionality of data value movement in the connection circuitry 633 connected to corresponding nodes 634 of the shared I/O lines 655. However, whether the double-headed arrows are pointing to right in end 661-0 or to the left in end 661-1 does not necessarily represent a direction of data value movement in a connected shared I/O line. For example, as shown in the data shift operation illustrated in FIG. 6B, shift portion 3, as shown at 666, includes a write operation from shift element 632-1-2 to shared I/O line 655-Z. In addition, referring to an "end" of an array, e.g., as indicated 661-0 and 661-1 in FIGS. 6A and 6B and 761-0 and 761-1 in FIGS. 7A and 7B, is intended to indicate a relative direction of data value movement and not necessarily a physical end of the array, as appropriate to the context.

Despite the associated connection circuitry pointing to the left, the shifted data value is shown to be moved toward the right in shared I/O line 655-Z. The shifted data value may be moved to the right, in some embodiments, for completion of the data shift operation by sending the shifted data value to be written in a corresponding location connected to shared I/O line 655-Z in another subarray, partition, bank, etc. In some embodiments, the circuitry indicated by reference numbers 655-X and 655-Z may represent rotation circuitry for rotating the data value from a first shared I/O line at one end of an array, e.g., from shared I/O line 655-E, to a second shared I/O line at an opposite end of the array, e.g., to shared I/O line 655-0.

As illustrated in FIGS. 6A and 6B, each shared I/O line may include one shift element positioned toward each of the ends 661-0, 661-1 of the shared I/O line in each portion of the shared I/O line, e.g., in each subarray, partition, bank, etc. As such, shared I/O lines 655-0, 655-1, 655-2, and 655-3 included in performing the data shift operation shown in FIG. 6B are each shown to include paired shift elements. For example, shared I/O line 655-1 is shown with shift element 632-0-0 positioned toward end 661-0 and shift element 632-1-0 positioned toward end 661-1. Intervening shared I/O lines 655-B, 655-C, 655-D, and 655-E positioned adjacent to and/or between shared I/O lines 655-0, 655-1, 655-2, and 655-3 also are each shown to include paired shift elements. Depending upon where a data shift operation begins, e.g., in which portion of a row selectably coupled to a particular shared I/O line, and/or how many data values are to be shifted, e.g., all contiguous data values in the row, the shared I/O lines included in performing a portion of the data shift operation may become intervening shared I/O lines that are skipped over in performing another portion of the data shift operation, e.g., on data values obtained from memory cells in another portion of the row. The intervening shared I/O lines previously skipped over in performing the portion of the data shift operation may become shared I/O lines included in performing another portion of the data shift operation.

The portions of a shift corresponding to each data value each may be performed in a single step or in a plurality of steps over the intervening shared I/O lines to the intended destination. For example, in shifting a data value from a memory cell in column 422-7 in portion 462-0 of subarray 425-0 in FIG. 4A to a memory cell in corresponding column 422-X−1 in portion 462-M−1 of subarray 425-0 in FIG. 4B, one or more steps may be performed over corresponding columns in a number of intervening portions of subarray 425-0, e.g., intervening portions of a row, such as 319 shown in FIG. 3. By skipping over each of the intervening number of columns in the intervening portions, a step size may be characterized as stepping a particular number of bits. For example, the step size may be 64 bits or 128 bits corresponding to a total of the skipped over intervening shared I/O lines selectably coupled to the columns in each portion of the row that are skipped over and the destination shared I/O line to which the data value is read, among other possible sizes of steps and/or number of bits. Shifting as such may be performed with an increased speed, rate, and efficiency than may be accomplished with single-bit shifts.

A size of the step by which a portion of the data shift operation skips in a first direction over a number of first intervening shared I/O lines, e.g., one intervening shared I/O line to a plurality of intervening shared I/O lines, to reach a destination shared I/O line, e.g., from intervening shared I/O lines 655-B to destination I/O line 655-0 in FIGS. 6A and 6B, is referred to herein as a "span" of the step. As presented herein, a span is intended to mean a same number of shared I/O lines, e.g., a total of the number of intervening shared I/O lines and a destination shared I/O line, in the first direction and the second direction by which a first shared I/O line, e.g., 655-0, and a second shared I/O line, e.g., 655-1, are offset from a particular shared I/O line 655-1 to which a respective shift element, e.g., 632-0-0, is adjacent. There may be various embodiments in which there is a pattern of connection from the shift elements to the shared I/O lines, a non-limiting example of which is using a fixed number of one or more spans in both directions. For example, there may be one span or a plurality of spans in the first and second directions and/or the offset of each number of spans from the particular shared I/O line may be fixed or adjustable.

FIGS. 6A and 6B appear to indicate the span to be 2 for purposes of clarity. However, embodiments are not so limited. For example, the intervening shared I/O lines 655-B, 655-C, 655-D, and 655-E positioned adjacent to and/or between shared I/O lines 655-0, 655-1, 655-2, and 655-3 each may represent a plurality of intervening shared I/O lines that contribute to a span of, for example, 64 or 128 in each direction. The size of the span achieved by skipping over intervening shared I/O lines 655-B and 655-C on each side of shared I/O line 655-1 may, in various embodiments, be the same or different depending upon a preferred configuration. In some embodiments, there may be more connection circuitry than one line on each side of a respective shift element such that a shift element may connect on one or both sides to a plurality of shared I/O lines by having more than one span on that side of the shift element.

The paired shift elements, e.g., 632-0-0 and 632-1-0 shown in FIGS. 6A and 6B, may have matching configurations, e.g., of a latch, as shown at 535-1 in FIG. 5, and associated circuitry. For example, as shown in FIGS. 6A and 6B, shift element 632-0-0 in end 661-0 may have connection circuitry 633-0-1 selectably coupled to node 634-0-1 of adjacent shared I/O line 655-1. Shift element 632-0-0 may have connection circuitry 633-0-0 selectably coupled to node 634-0-0 of shared I/O line 655-0 by skipping over intervening shared I/O lines 655-B. In addition, shift element 632-0-0 may have connection circuitry 633-0-2 selectably coupled to node 634-0-2 of shared I/O line 655-2 by skipping over intervening shared I/O lines 655-C.

The configuration of shift element 632-0-0 and associated circuitry just described may, in some embodiments, match and/or mirror a configuration of corresponding shift element 632-1-0 in end 661-1. For example, shift element 632-1-0 may have connection circuitry 633-1-1 selectably coupled to node 634-1-1 of the adjacent shared I/O line 655-1. Shift element 632-1-0 may have connection circuitry 633-1-0 selectably coupled to node 634-1-0 of the shared I/O line 655-0 by skipping over the intervening shared I/O lines 655-B. In addition, shift element 632-1-0 may have connection circuitry 633-1-2 selectably coupled to node 634-1-2 of the shared I/O line 655-2 by skipping over the intervening shared I/O lines 655-C.

FIG. 6B illustrates a data shift operation performed using the data shift circuitry shown at 561-0 and described in connection with FIG. 5 and/or the data shift circuitry shown in and described in connection with FIG. 6A. For example, a data shift operation may include shift portion 1, shown at 663 in FIG. 6B, in which a data value is accessed from shared I/O line 655-0 by shift element 632-0-0 selectably coupling node 634-0-0 in order to write the data value to shift element 632-0-0, e.g., to a latch as shown at 535-1 in FIG. 5. As such, shift portion 1 results in a shift of one span for the data value, e.g., of 64 bits when the size of the span is 64 shared I/O lines. In some embodiments, a span may correspond to a multiple of 64 shared I/O lines, e.g., spans of 64 bits, 128 bits, 256 bits, etc.

The data shift operation also may include shift portion 2, shown at 655, in which the data value is read from shift element 632-0-0 in end 661-0 to shared I/O line 655-2 by selectably coupling node 634-0-2 and is accessed from shared I/O line 655-2 by shift element 632-1-2 in end 661-1 selectably coupling node 634-2-2 to write the data value to shift element 632-1-2. As such, shift portion 2 results in a shift of two spans for the data value, e.g., a shift portion of 128 bits when the size of the span is 64 shared I/O lines.

Accordingly, as described herein, there may be a pair of a first shift element, e.g., 632-0-0, and a second shift element, e.g., either of shift elements 632-1-1 and 632-1-2. Each shift element in the pair, e.g., first shift element 632-0-0, may be configured to move a data value from a coupled first shared I/O line, e.g., shared I/O line 655-0, offset in a first direction by a span of shared I/O lines, e.g., intervening shared I/O lines 655-B, to the second shift element, e.g., shift element 632-1-1, coupled to a second shared I/O line, e.g., shared I/O line 655-2, offset in a second direction by the span of shared I/O lines, e.g., intervening shared I/O lines 655-C. The second shared I/O line 655-2 may be positioned between the first shared I/O line 655-0 and a third shared I/O line, e.g., shared I/O line 655-3, where the first shared I/O line 655-0 and the third shared I/O line 655-3 may each be separated from the second shared I/O line 655-1 by at least one intervening shared I/O line, e.g., such that the span may be 64 or 128 bits, for example.

As such, a data shift operation may be performed utilizing a pair of a first shift element 632-0-0 and a second shift element 632-1-1. Each shift element in the pair may be configured to selectably couple a particular, e.g., adjacent, shared I/O lines 655-1 or 655-2, of the respective plurality of shared I/O lines and shift the data value from a coupled first shared I/O line 655-0, offset in a first direction by a span of intervening shared I/O lines 655-B from the adjacent shared I/O line 655-1, to the second shift element 632-1-1 coupled to a second shared I/O line 655-2 offset in a second direction by the span of shared I/O lines 655-C from the particular shared I/O line 655-1.

Each shift element, e.g., 632-0-0, may be further configured to selectably couple a first shared I/O line, e.g., 655-1, of the first subset of the plurality of sense lines, e.g., sense lines 405-0, 405-1, 405-2, etc., in portion 462-0 of subarray 425-0, to a second shared I/O line, e.g., 655-0, of the second subset of the plurality of sense lines and to a third shared I/O line, e.g., 655-2, of a third subset of the plurality of sense lines. The second shared I/O line 655-1 is offset relative to the first shared I/O line 655-0 in a direction opposite from an offset of the third shared I/O line 655-2 relative to the first shared I/O line 655-1. The first shift element, e.g., 632-0-0, may be positioned adjacent to the first shared I/O line 655-1. The first shift element, e.g., 632-0-0, may be configured to read a data value from the coupled second shared I/O line, e.g., 655-0, offset in the first direction and write the data value to a second shift element, 632-1-1, coupled to the second shared I/O line, e.g., 655-2, offset in the second direction in order to perform the data shift operation. As described herein, the read operation and the write operation may be performed at different times, e.g., in different clock cycles.

In some embodiments, a controller, e.g., as shown at 140 and described in connection with FIGS. 1A, 1B, and 1C and elsewhere herein, may be configured to selectably couple the first shift element 632-0-0 to the first shared I/O line 655-0 and the second shared I/O line 655-2 via connection circuitry 633-0-0 and 633-0-2 that extends in the first direction and the second direction, respectively. The connection circuitry may be configured to couple the first shift element 632-0-0 to the first shared I/O line 655-0 at a first node 634-0-0 and couple the first shift element 632-0-0 to the second shared I/O line 655-2 at a second node 634-0-2.

In some embodiments, the first shift element 632-0-0 and the second shift element 632-1-1 or 632-1-2 may be configured as pairs positioned adjacent each of the respective plurality of shared I/O lines, e.g., shared I/O lines 655-1, 655-2, and 655-3, respectively. A plurality of first shift elements, e.g., shift elements 632-0-0, 632-0-1, 632-0-2, among others, may be configured as a first set positioned toward the first end 661-0 of the respective plurality of shared I/O lines and a plurality of second shift elements, e.g., shift elements 632-1-0, 632-1-1, and 632-1-2, among others, may be configured as a second set positioned toward the second end 661-1 of the respective plurality of shared I/O lines. To shift a data value may, in some embodiments described herein, include to move the data value between the first set of shift elements and the second set of shift elements along a length of at least one of the respective plurality of shared I/O lines. A "length" of a shared I/O line is intended to mean to move a data value either a total length or a partial length of the shared I/O line in a subarray, partition, bank, etc. For example, the data value is shown to move along a partial length of shared I/O line 655-2 when shifting the data value a distance of two spans.

As described herein, a first shift element, e.g., 632-0-0, may be positioned toward one end 661-0 of a particular shared I/O line, e.g., 655-1, in the first direction from a second shared I/O line, e.g., 655-2, and a second shift element, e.g., 632-1-2, may be positioned toward an opposite end 661-1 of a different shared I/O line, e.g., 655-3, in the second direction from the second shared I/O line 655-2. The controller 140 may be further configured to move the data value along a length of the second shared I/O line 655-2 to shift the data value the distance of two spans from the first shift element 632-0-0 to the second shift element 632-1-2. The first shift element 632-0-0 and the second shift element 632-1-2 may both be coupled to the second shared I/O line 655-2, e.g., simultaneously or sequentially.

The first shift element 632-0-0 may be adjacent and selectably coupled to a particular shared I/O line 655-1 in the first direction from the second shared I/O line 655-2 and the second shift element 632-1-2 may be adjacent and selectably coupled to a different shared I/O line 655-3 in the second direction from the second shared I/O line 655-2. The particular shared I/O line 655-1 and the different shared I/O line 655-3 to which the first shift element 632-0-0 and the second shift element 632-1-2 are adjacent and selectably coupled also may be separated by the distance of two spans.

The controller 140 may be further configured to selectably couple the first shift element 632-0-0 to the second shared I/O line 655-2 offset in the second direction by the span of intervening shared I/O lines 655-C and selectably couple the second shift element 632-1-2 to the second shared I/O line 655-2 offset in the first direction by a span of intervening shared I/O lines 655-D. As such, a data value may be shifted the distance of two spans from the first shift element 632-0-0 to the second shift element 632-1-2.

Accordingly, the first shift element 632-0-0 may be configured to selectably couple the first shared I/O line 655-0 as a source to shift the data value across the span, e.g., via connection circuitry 633-0-0, to the first shift element 632-0-0 and shift the data value across the span to the second shared I/O line 655-2. In some embodiments, shifting, e.g., copying, a data value into a first shift element from a first shared I/O line may be performed in a first clock cycle, as described herein, and shifting, e.g., writing, the data value to the second shared I/O line may be performed in a second clock cycle. The second shift element 632-1-2 may be configured to selectably couple the second shared I/O line 655-2 to receive movement of the data value across the span as a first destination and selectably couple a third shared I/O line 655-Z to move the data value across the span to a third shift element (not shown) as a second destination.

As described herein, a memory device 120 may include a plurality of subarrays, e.g., as shown at 125-0, 125-1, . . . , 125-N–1 and described in connection with FIG. 1C, in the array 130 of memory cells. A plurality of shared I/O lines, e.g., shared I/O line 155 FIG. 1C and/or shared I/O lines 455-0, 455-1, . . . , 455-M–1 between subarrays 425-0, 425-1, . . . , 425-N–1 in FIGS. 4A and 4B, may each be configured to selectably and bidirectionally move a data value within and between the respective plurality of subarrays. In some embodiments, the data shift operation may be performed in a first subarray, e.g., subarray 125-0, and a data source location and/or a data destination location may be in a second subarray, e.g., subarray 125-1. In some embodiments, data source location may be in a second subarray, e.g., subarray 125-1, and the data destination location may be in a third subarray, e.g., subarray 125-2.

The controller 140 may be further configured to issue a single set of first control signals, e.g., as shown at 545 and described in connection with FIG. 5, to direct the plurality of first shift elements of the first set, e.g., shift elements 632-0-0, 632-0-1, 632-0-2, among others, to move a respective plurality of data values to a corresponding plurality of the second shift elements of the second set, e.g., shift elements 632-1-0, 632-1-1, and 632-1-2, among others. The controller 140 may be further configured to issue a single set of second control signals to direct the plurality of second shift elements of the second set to move a respective plurality of data values to a corresponding plurality of the first shift elements of the first set. The first control signals may be different from the second control signals based upon a differential of read operations and write operations being performed by the first set and the second set.

The data shift operation also may include, in various embodiments, shift portion 3, shown at 666, in which the data value is read from shift element 632-1-2 in end 661-1 to shared I/O line 655-Z by selectably coupling a particular node (not shown) and writing the data value to a destination location. In various embodiments, the destination location may be the same as the source location, e.g., in the same subarray, partition, bank, etc., from which the data value was originally accessed in shift portion 1. For example, the source location and/or the destination location may be in the same subarray, partition, bank, etc., in which the data shift operation is performed. Alternatively, the source location and/or the destination location may be in a different subarray, partition, bank, etc., than the subarray, partition, bank, etc., in which the data shift operation is performed. For example, as shown in the shift portion 3 at 666, a read operation and/or a write operation from shift element 632-

1-2 to shared I/O line 655-Z may send the data value to a destination location in a different subarray, partition, bank, etc.

The data shift operation shown in and described in connection with FIGS. 6A and 6B illustrates a shift of 4 spans. For example, a data value may be shifted from shared I/O line 655-0 to shift element 632-0-0 associated with shared I/O line 655-1, then to shared I/O line 655-2, from which the data value is shifted to shift element 632-1-2 associated with shared I/O line 655-3, after which the data value is shifted to shared I/O line 655-Z. This embodiment of the data shift operation, in which the data value is shifted 4 spans, may be performed in three clock cycles.

In the first clock cycle, the data value may be sent from a source location (not shown) along shared I/O line 655-0 and shifted one span by skipping over the intervening shared I/O lines 655-B to the shift element 632-0-0 positioned toward end 661-0 of shared I/O line 655-1. In the second clock cycle, the data value may be shifted a second span from the shift element 632-0-0 to shared I/O line 655-2, wherein the data value may, in some embodiments, be moved from end 661-0 to end 661-1, and the data value may be shifted a third span from shared I/O line 655-2 to shift element 632-1-2 associated with end 661-1 of shared I/O line 655-3. In the second clock cycle, the shifting of the data value may skip over intervening shared I/O lines 655-C and 655-D to be stored by shift element 632-1-2.

In the second clock cycle described above, it is notable that the data value is shifted by two spans. Data shift operations may be performed by linking a sequence of steps (n) of such two span shifts. For example, shifting of a data value by 2*n spans may be performed in n+1 clock cycles and shifting the data value by (2*n)+1 spans may be performed in n+2 clock cycles.

In the third clock cycle, the data value may be shifted the fourth span from shift element 632-1-2 to shared I/O line 655-Z by skipping over intervening shared I/O lines 655-E. In the third clock cycle, the data value may be shifted from shift element 632-1-2 in end 661-1 by one span to another shift element (not shown) in end 661-0 associated with shared I/O line 655-Z. In a fourth clock cycle, the data value may again be shifted by one span from shift element 632-1-2 to its destination location. Such one span shifts may each be performed in one clock cycle. The data value may be moved in shared I/O line 655-Z to a destination location (not shown). Alternatively, the data value may be moved in shared I/O line 655-Z to a destination location (not shown) in the third clock cycle. As described herein, the destination location for the shifted data value may be in the same or in a different subarray, partition, bank, etc., as the source location. Moreover, the source location and/or the destination location may be in the same or in a different subarray, partition, bank, etc., as the location in which the data shift operation is performed.

When a size of the data shift operation is an odd number of spans, in some embodiments, a number of single-bit shift operations, as described herein, may be performed as part of, in addition to, or instead of the data shift operation utilizing the shift elements selectably coupled to the shared I/O lines. Each single-bit shift of a data value, e.g., a bit vector, may be performed in one clock cycle.

FIG. 7A is a schematic diagram illustrating another example of circuitry configured for a data shift operation in a memory device in accordance with a number of embodiments of the present disclosure. The shift elements 732 and associated connection circuitry illustrated in end 761-0 of FIGS. 7A and 7B may represent and/or be included in the data shift circuitry 561-0 illustrated in FIG. 5 and/or illustrated in FIGS. 6A and 6B and may represent at least a portion of the functionality embodied by and contained therein. Shift elements 732 in end 761-0 and shift elements 772 in end 761-1 shown in FIGS. 7A and 7B each may represent one of a pair of shift elements. However, in contrast to shift elements 732 in end 761-0, and the corresponding shift elements 632 shown in and described in connection with FIGS. 6A and 6B, shift elements 772 may each be selectably coupled to only an adjacent shared I/O line, e.g., shared I/O line 755-1, at a single node, e.g., node 779-1, by a single line of connection circuitry, e.g., connection circuitry 780-1.

As illustrated in FIGS. 7A and 7B, a first set of shift elements 732 in end 761-0 each may be selectably coupled to the same adjacent shared I/O line to which a paired second set of shift elements 772 in end 761-1 are selectably coupled. As such, a data value may be bidirectionally moved on the adjacent shared I/O line between a particular shift element 732 and a particular paired shift element 772. In addition, as described in connection with FIGS. 6A and 6B, shift elements 732, e.g., 732-0-0, are selectably coupled to connection circuitry, e.g., 733-0-0 and 733-0-2, that enables shifting a data value over intervening shared I/O lines, e.g., 755-B or 755-C, to or from a shared I/O line, e.g., 755-0 or 755-2, to which a particular shift element 772, e.g., 772-0 or 772-2, in end 761-1 may be selectably coupled. In some embodiments, the sensing circuitry, e.g., as shown at 350 and described in connection with FIG. 3, may be, e.g., the sense amplifiers and/or compute components thereof, and/or may include the second set of shift elements 772, e.g., when the shift circuitry is positioned in association with end 761-1.

The shift elements, e.g., 772-0, 772-1, 772-2, 772-3, selectably coupled to only the adjacent shared I/O, e.g., 755-0, 755-1, 755-2, 755-3, all may be positioned toward one end, e.g., either of ends 761-0 or 761-1, of the respective shared I/O lines, and all of shift elements 732 may be positioned toward the opposite end. In some embodiments, a number of shift elements 772 may be positioned toward one end, e.g., end 761-0, and a number of shift elements 732 may be positioned toward the same end in the same or in different subarrays, partitions, banks, etc.

For purposes of clarity, shift elements 732 and 772 and associated circuitry are illustrated in FIGS. 7A and 7B as being staggered in the respective ends 761-0, 761-1 of shared I/O lines 755 relative to a middle region of the shared I/O line indicated by a dashed line. However, embodiments are not so limited. For example, in various embodiments, the two shift elements selectably coupled to each portion of a shared I/O line associated with a subarray, partition, bank, etc., may be positioned at the respective ends, e.g., as shown in FIG. 3, rather than being in a staggered configuration toward the respective ends, e.g., as shown in FIGS. 6A and 6B and 7A and 7B.

FIG. 7B is a schematic diagram illustrating another example of performance of a data shift operation in a memory device in accordance with a number of embodiments of the present disclosure. In the example data shift operation illustrated in FIG. 7B, a particular shift element, e.g., 732-0-0, of the first set may be configured to selectably couple the shared I/O line, e.g., 755-1, offset, e.g., via connection circuitry 733-0-2, in the second direction by the span to shift a data value. A particular shift element, e.g., 772-2, of the second set may be configured to store the shifted data value received via the shared I/O line. A controller 140 may be configured to move the data value along a length of the shared I/O line, e.g., 755-2, to the particular shift element, e.g., 772-2, of the second set, couple a different shift element, e.g., 732-0-2, of the first set to the shared I/O line, e.g., 755-2, offset in the first direction by the span to access the data value stored by the particular shift element, e.g., 772-2, of the second set. The controller 140 may be further configured to move the data value along the length of the shared I/O line, e.g., 755-2, to the different first shift element, e.g., 732-0-2, of the first set to shift the data value a total distance of two spans.

For example, a data shift operation shown in and described in connection with FIG. 7B may include shift portion 1, shown at 773, in which a data value is accessed from shared I/O line 755-0 by shift element 732-0-0 selectably coupling node 734-0-0 in order to write the data value to shift element 732-0-0, e.g., to a latch as shown at 535-1 in FIG. 5. As such, shift portion 1 results in a shift of one span for the data value, e.g., of 64 bits when the size of the span is 64 shared I/O lines. The data shift operation may include shift portion 2, shown at 774, in which the data value is read from shift element 732-0-0 in end 761-0 to shared I/O line 755-2 by selectably coupling node 734-0-2 and is accessed from shared I/O line 755-2 for storage by shift element 772-2 in end 761-1. The data shift operation may include shift portion 3, shown at 775, in which the shift element 772-2 couples node 780-2 via connection circuitry 779-2 to enable the stored data value be moved along shared I/O line 755-2 and shifted one span to shift element 732-0-2 in end 761-0 to write the data value to shift element 732-0-2. The data shift operation also may include shift portion 4, shown at 776, in which the data value may be read from shift element 732-0-2 in end 761-0 to shared I/O line 755-Z by selectably coupling a particular node (not shown) and writing the data value, in some embodiments, to a destination location, e.g., as described in connection with shift portion 3 shown at 666 and described in connection with FIG. 6B.

As such, a first clock cycle for shift portion 1 shown in FIG. 7B may correspond to the first clock cycle for shift portion 1 shown in FIG. 6B. In contrast, in the second clock cycle shown in FIG. 7B, the data value has been shifted by one span coming from shift element 732-0-0 in end 761-0. However, the data value is written in clock cycle 2 and read in clock cycle 3 by shift element 772-2 adjacent shared I/O line 755-2 in end 761-1, which results in the data value being shifted one span again when shift element 732-0-2 in end 761-0 selectably couples the shared I/O line 755-2 in clock cycle 4. For example, shifting of a data value as just described by 2*n spans may be performed in n+1 clock cycles and shifting the data value by (2*n)+1 spans may be performed in n+2 clock cycles.

In various embodiments consistent with FIGS. 6A and 6B and/or FIGS. 7A and 7B, a first shift element, e.g., 632-0-0 or 732-0-0, and a second shift element, e.g., 632-1-0 or 772-1, may be configured as the respective pair and may both be positioned toward one end of each of the respective plurality of shared I/O lines, e.g., positioned either at or toward end 761-0 or end 761-1 of shared I/O line 755-1, for example. In such an embodiment, the data value may be shifted from a first pair of shift elements, e.g., 632-0-0/632-1-0 or 732-0-0/772-1, positioned toward the end of a first shared I/O line, e.g., 655-1 or 755-1, via connection circuitry (not shown) coupled to a second pair of shift elements, e.g., 632-0-1/632-1-1 or 732-0-1/772-2, positioned toward the same end of a second shared I/O line, e.g., 655-2 or 755-2.

Embodiments of the present disclosure provide a method to increase a speed, rate, and efficiency of a memory device performing data shift operations. As described herein, a method can, in various embodiments, include receiving control signals, e.g., as shown at 545 and described in connection with FIG. 5, from a controller, e.g., controller 140 described in connection with FIGS. 1A, 1B, and 1C and elsewhere herein, coupled to an array 133 of memory cells that direct moving, e.g., by performance of a shift operation and/or a rotation operation, a data value from a source location to a destination location in the array. The method may include selectably coupling a first shift element, e.g., 632-0-0, to a first shared I/O line, e.g., 655-0, moving the data value from the first shared I/O line as the source location to the first shift element, and selectably coupling the second shift element, e.g., 632-1-1, to a second shared I/O line, e.g., 655-2. Accordingly, the method may include moving the data value from the second shift element to the second shared I/O line.

The method may include, in some embodiments, moving the data value from the first shift element, e.g., 632-0-0, to a second shift element, e.g., shift element 632-1-0 selectably coupled to a same shared I/O line 655-1 as the first shift element 632-0-0, before selectably coupling the second shift element, e.g., 632-1-0, to a second shared I/O line, e.g., 655-2. In various embodiments, the method may include offsetting the first shift element 632-0-0 from the first shared I/O line 655-0 in a first direction, e.g., via connection circuitry 633-0-0, by a span of shared I/O lines, e.g., 655-B, and offsetting the second shift element 632-1-1 from the second shared I/O line 655-2 in a second direction by the span of shared I/O lines, e.g., 655-C. In some embodiments, the span of shared I/O lines refers to a span of a same number of shared I/O lines in the first direction and in the second direction. For example, the method may include moving the data value a distance of two spans from the first shared I/O line as the source location to the second shared I/O line as the destination location. As such, the data value may be shifted a distance of two spans from the first shared I/O line, e.g., 655-0, as the source location to the second shared I/O line, e.g., 655-2, as the destination location. The method may include positioning the first shift element, e.g., 632-0-0, adjacent and selectably coupled to a shared I/O line, e.g., 655-1, between the first shared I/O line, e.g., 655-0, and the second shared I/O line, e.g., 655-2, and positioning the second shift element, e.g., 632-1-1, adjacent and selectably coupled to the second shared I/O line, e.g., 655-2.

The controller 140 may be configured to direct moving, e.g., shifting, the data value an even number of spans from a source location to a destination location. For example, when each shift element is configured to connect by one span in the first direction to a shared I/O line and one span in the second direction to another shared I/O line, a data value may be shifted a distance of two spans. Additional shift elements similarly configured may be utilized to perform a total data shift operation that is a multiple of two spans, which would be an even number of spans.

The controller 140 may be further configured to direct moving, e.g., shifting, the data value by a single-bit shift operation, e.g., as described in connection with FIG. 2A, to an odd-numbered span to which the data value is to be shifted. For example, the source of the data value may be memory cells in a portion, e.g., 462-0, of a subarray selectably coupled to shared I/O line 655-1 and adjacent shift element 632-0-0 and the destination location may be memory cells in a next portion, e.g., 462-1, of the subarray selectably coupled to shared I/O line 655-2 and adjacent shift element 632-1-1. This would be a total shift of an odd number of spans, e.g., one span. As such, the controller may be configured to decide to shift the data value utilizing sensing circuitry, e.g., as shown at 250 in FIG. 2B, of the array to perform the single-bit shift operation via connection circuitry (not shown) that connects adjacent shift elements from an even-numbered span to the odd-numbered span. The decision may be dependent upon the relative speed, rate, and efficiency of performing the data shift operation utilizing the shift elements and shared I/O lines as described herein, versus utilizing the single-bit shift operation, e.g., based on logic as shown at 170 and/or instructions as shown at 171 and described in connection with FIGS. 1A and 1B.

The controller 140 may be configured to direct selecting, e.g., by execution of logic and/or stored instructions, between a number of shifts of the data value, e.g., a bit vector, from the source location to the destination location. The number of shifts may include: a number of shifts across a number of spans when the source location and the destination location are separated by the number of spans, e.g., an even number of spans, such as 2, 4, 6, 8, etc., spans that correspond to 1, 2, 3, 4, etc., spans in each direction from a particular shared I/O line; a number of shifts across a an even number of spans and a number of single-bit shift operations when the source location and the destination location are separated by the an odd number of spans, e.g., shifts across an even number of spans, such as 2, 4, 6, 8, etc., and a number of single-bit shift operations when separated by an odd number of spans, such as 3, 5, 7, 9, etc., when one more span is on either side of the even number of spans; a number of shifts across a number of spans when the source location and the destination location are partially separated by a number of spans and a number of single-bit shift operations when a remainder of a separation between the source location and the destination location is a portion of a span; a number of single-bit shift operations selectably performed before, between, or after performance of a number of shifts across a number of spans. Accordingly, a number of single-bit shift operations may be performed when the source location and the destination location are separated by any number of spans and/or a portion of a span, and various combinations thereof.

An example of a selection process that the controller 140 may use for full bit vector shifts within a same subarray follows. If a distance to be shifted is small enough that single-bit shifts are faster, single-bit shifts may be selected. Otherwise, if the shift distance is D and the span is S, the shift elements may be used to shift N spans, where N is the largest integer such that N*S≤D, and a modulo remainder of dividing D by S may be used to determine a number of single-bit shifts to be performed. Whether N is even or odd may affect how the shift element controls are configured. In some embodiments, N being small enough may trigger single-bit-only shifts independently of the even/odd status.

In addition, a distance between the source location and the destination location, e.g., in a same subarray, a length of the bit vector, whether the bit vector is to be shifted and/or rotated, and/or whether the input from the source location and the output of the bit vector to the destination location are in the same subarray, partition, and/or bank of a memory device may be used in selection of an appropriate shift option from the options presented above.

In some embodiments, the controller 140 may be further configured to direct rotating the data value from a first shared I/O line, e.g., 665-Z, at one end of the array via rotation circuitry (not shown) that connects the first shared I/O line to a second shared I/O line, e.g., 655-X, at an opposite end of the array. The rotation may occur when a data shift operation would result in movement of data values out of the one end of the array, e.g., which may then be lost.

After rotation to the second shared I/O line at the opposite end of the array, the data values may be stored by memory cells associated with the second shared I/O line, e.g., in a portion of a subarray. The data values may be stored by memory cells selectably coupled to the second shared I/O line, e.g., 655-X, whose data values have been shifted, e.g., previously or substantially at the same time, by the data shift operation inward from the opposite end of the array to a destination location for the shifted data values.

In some embodiments, the controller may be further configured to direct masking a particular portion of the array to prevent writing a shifted data value to a number of shift elements and/or memory cells in the particular portion. For example, the particular portion may be used to store operating system instructions, among other types of data that are preferably retained unaltered, e.g., by not being erased, overwritten, etc. In some embodiments, the controller may be further configured to direct clearing a particular portion of the array to prevent overwriting a shifted data value to a number of memory cells selectably coupled to shift elements and shared I/O lines in the particular portion. For example, the cleared data values may be moved to another portion of the array, e.g., moved to another subarray via the shared I/O lines described herein.

In a DRAM implementation, a shared I/O line can be used as a data path to move, shift, and/or rotate data in the memory cell array between various locations, e.g., portions of rows, subarrays, banks, etc., in the memory array. A particular shared I/O line can be shared between all sensing component stripes and/or all shift elements selectably coupled to that particular shared I/O line. In various embodiments, one sensing component stripe, one pair of sensing component stripes, one shift element, and/or one pair of shift elements, e.g., coupling a source location and a destination location, can communicate with the shared I/O line at any given time. The particular shared I/O line is used to accomplish moving, shifting, and/or rotating the data from one sensing component stripe to the other sensing component stripe and/or from one shift element to another shift element selectably coupled to the particular shared I/O line. A row coupled to the first sensing component stripe can be opened and the data values of the memory cells in the row can be sensed. After sensing, the first sensing component stripe can be opened to the shared I/O line, along with opening the second sensing component stripe to the same shared I/O line. The second sensing component stripe can still be in a pre-charge state, e.g., ready to accept data. After the data from the first sensing component stripe has been moved, e.g., driven, into the second sensing component stripe, the second sensing component stripe can fire, e.g., latch, the data into respective sense amplifiers and/or compute components. A row coupled to the second sensing component stripe can be opened, e.g., after latching the data, and the data that resides in the sense amplifiers and/or compute components can be written into the destination location of that row.

While example embodiments including various combinations and configurations of sensing circuitry, sense amplifiers, compute components, sensing component stripes, shared I/O lines, column select circuitry, multiplexers, shift elements, latches, connection circuitry, nodes, etc., have been illustrated and described herein, embodiments of the present disclosure are not limited to those combinations explicitly recited herein. Other combinations and configurations of the sensing circuitry, sense amplifiers, compute components, sensing component stripes, shared I/O lines, column select circuitry, multiplexers shift elements, latches, connection circuitry, nodes, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device, comprising:
      an array of memory cells;
      sensing circuitry coupled to the array via a plurality of sense lines;
      a first shared I/O line configured to selectably couple a first subset of the plurality of sense lines and a second shared I/O line configured to selectably couple a second subset of the plurality of sense lines;
      a shift element configured to selectably couple the first shared I/O line to the second shared I/O line to enable a data shift operation; and
      a controller configured to direct selectable coupling of the array, the sensing circuitry, and the shift element to enable a shift of a data value from the first shared I/O line to the second shared I/O line.

2. The apparatus of claim 1, wherein the data shift operation comprises:
   a plurality of data values each stored in a first portion of a row, as a source location, by a corresponding plurality of memory cells coupled to a corresponding number of sense lines that are selectably coupled to the first shared I/O line;
   the shift element coupling the first shared I/O line to the second shared I/O line; and
   movement of the plurality of data values to a corresponding plurality of memory cells in a second portion of the row, as a destination location, coupled to a corresponding number of sense lines selectably coupled to the second shared I/O line; and
   wherein the data shift operation further comprises a similar data shift operation performed by movement of data values each stored in the second portion of the row to a corresponding plurality of memory cells in a third portion of the row.

3. The apparatus of claim 1, wherein:
   the sensing circuitry comprises a sense amplifier or a compute component coupled to a particular sense line; and
   the sensing circuitry is configured to couple a particular subset of sense lines to a particular shared I/O line in order to implement the data shift operation.

4. The apparatus of claim 1, wherein the sensing circuitry is formed on pitch with complementary sense lines for corresponding complementary memory cells of a dynamic random access memory (DRAM) array.

5. The apparatus of claim 1, wherein the shift element comprises:
   a latch configured to receive a data value via a first shared I/O line and configured to send the data value via a second shared I/O line to perform the data shift operation; and
   a select element configured to enable the data value to be selectably received from a particular first shared I/O line and selectably sent to a particular second shared I/O line.

6. The apparatus of claim 5, wherein the select element comprises:
   first select circuitry configured to selectably receive a data value from a source location via the particular first shared I/O line selected from a plurality of shared I/O lines; and
   second select circuitry configured to selectably send the data value to a destination location via the particular second shared I/O line selected from the plurality of shared I/O lines.

7. The apparatus of claim 1, wherein the shift element is circuitry separate from the sensing circuitry.

8. The apparatus of claim 1, wherein the shift element is formed on pitch with the sense lines and the memory cells of the array.

9. The apparatus of claim 1, wherein the shift element is:
   formed on chip with and on a different plane than the first shared I/O line, the second shared I/O line, and the memory cells of the array; and
   further configured to couple the first shared I/O line at a first node and to couple the second shared I/O line at a second node.

10. The apparatus of claim 1, wherein:
    the shift element is further configured to selectably couple the first shared I/O line of the first subset of the plurality of sense lines to the second shared I/O line of the second subset of the plurality of sense lines and to a third shared I/O line of a third subset of the plurality of sense lines; and
    the second shared I/O line is offset relative to the first shared I/O line in a direction opposite from an offset of the third shared I/O line relative to the first shared I/O line.

11. An apparatus, comprising:
    a memory device, comprising:
       an array of memory cells;
       sensing circuitry coupled to the array via a plurality of sense lines;
       a plurality of shared I/O lines each configured to selectably and bidirectionally move a data value within the array; and
       a pair of shift elements comprising a first shift element and a second shift element, wherein each shift element in the pair is configured to:

couple a particular shared I/O line of the respective plurality of shared I/O lines selectably to a first shared I/O line and a second shared I/O line; and shift the data value from a coupled first shared I/O line, offset in a first direction by a span of shared I/O lines from the particular shared I/O line, to the second shift element coupled to a second shared I/O line offset in a second direction by the span of shared I/O lines from the particular shared I/O line; and a controller configured to direct selectable coupling of the array, the sensing circuitry, and the first and second shift elements to enable an operation to shift a data value from the first shared I/O line to the second shared I/O line.

12. The apparatus of claim 11, wherein:

the first shift element is positioned adjacent the first shared I/O line and is configured to:

read the data value from the coupled first shared I/O line offset in the first direction;

write the data value to the second shift element coupled to the second shared I/O line offset in the second direction in order to perform the data shift operation; and wherein the read operation and the write operation are performed in different clock cycles.

13. The apparatus of claim 11, wherein:

the span is a same number of shared I/O lines in the first direction and the second direction by which the first shared I/O line and the second shared I/O line are offset from the particular shared I/O line.

14. The apparatus of claim 11, wherein:

the first shift element is further configured to:

selectably couple the first shared I/O line as a source to shift the data value across the span to the first shift element; and shift the data value across the span to the second shared I/O line; and the second shift element is further configured to:

selectably couple the second shared I/O line to receive movement of the data value across the span as a first destination; and selectably couple a third shared I/O line to shift the data value across the span to a third shift element as a second destination.

15. The apparatus of claim 11, wherein the memory device further comprises:

a plurality of subarrays in the array of memory cells; and a plurality of shared I/O lines each configured to selectably and bidirectionally move a data value within and between the respective plurality of subarrays; and wherein the data shift operation is performed in a first subarray and a data source location and a data destination location are in a second subarray.

16. The apparatus of claim 15, wherein:

the second subarray is a subarray for the data source location that is different from a subarray for the data destination location.

17. An apparatus, comprising:

a controller coupled to a memory device and configured to direct a data shift operation, wherein the memory device comprises:

an array of memory cells;

sensing circuitry coupled to the array via a plurality of columns of the memory cells, the sensing circuitry including a sense amplifier or a compute component coupled to each of the columns and configured to implement a command from the controller to shift data values;

a plurality of shared I/O lines each configured to selectably and bidirectionally move a data value within the array; and a pair of a first shift element and a second shift element, wherein each shift element in the pair is configured to:

shift the data value from a coupled first shared I/O line, offset in a first direction by a span of shared I/O lines, to the second shift element coupled to a second shared I/O line offset in a second direction by the span of shared I/O lines.

18. The apparatus of claim 17, wherein the span is a multiple of 64 shared I/O lines.

19. The apparatus of claim 17, wherein:

the second shared I/O line is positioned between the first shared I/O line and a third shared I/O line; and the first shared I/O line and the third shared I/O line are each separated from the second shared I/O line by at least one intervening shared I/O line.

20. The apparatus of claim 17, wherein the controller is further configured to:

selectably couple the first shift element to the first shared I/O line and the second shared I/O line via connection circuitry that extends in the first direction and the second direction; and wherein the connection circuitry couples the first shift element to the first shared I/O line at a first node and couples the first shift element to the second shared I/O line at a second node.

21. The apparatus of claim 17, wherein the memory device further comprises:

the first shift element and the second shift element configured as the pair positioned adjacent each of the respective plurality of shared I/O lines;

a plurality of first shift elements configured as a first set positioned toward a first end of the respective plurality of shared I/O lines; and a plurality of second shift elements configured as a second set positioned toward a second end of the respective plurality of shared I/O lines; and wherein to shift the data value comprises to move the data value between the first set of shift elements and the second set of shift elements along a length of at least one of the respective plurality of shared I/O lines.

22. The apparatus of claim 21, wherein the controller is further configured to:

issue a single set of first control signals to direct the plurality of first shift elements of the first set to shift a respective plurality of data values to a corresponding plurality of the second shift elements of the second set; and issue a single set of second control signals to direct the plurality of second shift elements of the second set to shift a respective plurality of data values to a corresponding plurality of the first shift elements of the first set; and wherein the first control signals are different from the second control signals based upon a differential of read operations and write operations being performed by the first set and the second set.

23. The apparatus of claim 21, wherein the controller is further configured to:
- selectably couple the first shift element to the second shared I/O line offset in the second direction by the span of shared I/O lines;
- selectably couple the second shift element to the second shared I/O line offset in the first direction by the span of shared I/O lines; and
- shift a data value a distance of two spans from the first shift element to the second shift element.

24. The apparatus of claim 23, wherein:
- the first shift element is adjacent and selectably coupled to a particular shared I/O line in the first direction from the second shared I/O line;
- the second shift element is adjacent and selectably coupled to a different shared I/O line in the second direction from the second shared I/O line; and
- the particular shared I/O line and the different shared I/O line are separated by the distance of two spans.

25. The apparatus of claim 23, wherein:
- the first shift element is positioned toward one end of a particular shared I/O line in the first direction from the second shared I/O line;
- the second shift element is positioned toward an opposite end of a different shared I/O line in the second direction from the second shared I/O line; and
- the controller is further configured to shift the data value along a length of the second shared I/O line to shift the data value the distance of two spans from the first shift element to the second shift element; and
- the first shift element and the second shift element are both coupled to the second shared I/O line.

26. The apparatus of claim 21, wherein:
- a particular first shift element of the first set is configured to selectably couple the second shared I/O line offset in the second direction by the span to shift a data value;
- a particular second shift element of the second set is configured to store the shifted data value received via the second shared I/O line; and
- the controller is further configured to:
  - move the data value along a length of the second shared I/O line to the particular second shift element of the second set;
  - couple a different first shift element of the first set to the second shared I/O line offset in the first direction by the span to access the data value stored by the particular second shift element; and
  - move the data value along the length of the second shared I/O line to the different first shift element of the first set to shift the data value a distance of two spans.

27. The apparatus of claim 26, wherein the sensing circuitry comprises the second set of second shift elements.

28. The apparatus of claim 17, wherein the memory device further comprises:
- the first shift element and the second shift element configured as the pair positioned toward one end of each of the respective plurality of shared I/O lines; and
- wherein to shift the data value comprises to shift the data value from a first pair of shift elements positioned toward the end of a first shared I/O line via connection circuitry coupled to a second pair of shift elements positioned toward the end of a second shared I/O line.

29. A method for operating a memory device, comprising:
- receiving control signals from a controller coupled to an array of memory cells that direct moving a data value from a source location to a destination location in the array;
- selectably coupling a first shift element to a first shared I/O line;
- moving the data value from the first shared I/O line as the source location to the first shift element;
- selectably coupling a second shift element to a second shared I/O line; and
- moving the data value from the second shift element to the second shared I/O line.

30. The method of claim 29, wherein the method further comprises:
- offsetting the first shift element from the first shared I/O line in a first direction by a span of shared I/O lines; and
- offsetting the second shift element from the second shared I/O line in a second direction by the span of shared I/O lines.

31. The method of claim 29, wherein the method further comprises:
- moving the data value a distance of two spans from the first shared I/O line as the source location to the second shared I/O line as the destination location.

32. The method of claim 29, wherein the controller is configured to direct:
- moving the data value an even number of spans from the source location to the destination location.

33. The method of claim 29, wherein the controller is configured to direct:
- moving the data value by a single-bit shift operation to an odd-numbered span to which the data value is to be shifted; and
- moving the data value utilizing sensing circuitry of the array to perform the single-bit shift operation via connection circuitry that connects adjacent shift elements from an even-numbered span to the odd-numbered span.

34. The method of claim 29, wherein the controller is configured to direct:
- selecting, by execution of stored instructions, between a number of shifts of the data value from the source location to the destination location; and
- wherein the number of shifts include:
  - a number of shifts across a number of spans when the source location and the destination location are separated by the number of spans;
  - a number of shifts across a number of spans and a number of single-bit shift operations when the source location and the destination location are separated by the number of spans;
  - a number of shifts across a number of spans when the source location and the destination location are partially separated by a number of spans and a number of single-bit shift operations when a remainder of a separation between the source location and the destination location is a portion of a span; and
  - a number of single-bit shift operations selectably performed before, between, or after performance of a number of shifts across a number of spans.

35. The method of claim 34, wherein selecting between the number of shifts comprises selecting based on:
- a distance between the source location and the destination location;
- a length of a bit vector;
- whether the bit vector is to be shifted and rotated; and whether an input from the source location and an output of the bit vector to the destination location are in a same subarray, partition, or bank of the memory device.

36. The method of claim 29, wherein the controller is configured to direct:
rotating the data value from a first shared I/O line at one end of the array via rotation circuitry to a second shared I/O line at an opposite end of the array; and
wherein data values stored by memory cells selectably coupled to the second shared I/O line have been shifted by a data shift operation inward from the opposite end of the array to a destination location.

37. The method of claim 29, wherein the controller is configured to direct:
masking a particular portion of the array to prevent writing a shifted data value to a number of shift elements in the particular portion.

38. The method of claim 29, wherein the controller is configured to direct:
clearing a particular portion of the array to prevent overwriting a shifted data value to a number of memory cells selectably coupled to shift elements and shared I/O lines in the particular portion; and
wherein cleared data values are moved to another portion of the array.

* * * * *